(12) United States Patent
Inuzuka et al.

(10) Patent No.: US 10,418,099 B2
(45) Date of Patent: Sep. 17, 2019

(54) RESISTANCE CHANGE TYPE MEMORY

(71) Applicant: TOSHIBA MEMORY CORPORATION, Tokyo (JP)

(72) Inventors: Yuki Inuzuka, Kawasaki Kanagawa (JP); Tsuneo Inaba, Kamakura Kanagawa (JP); Takayuki Miyazaki, Tokyo (JP); Takeshi Sugimoto, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/906,453

(22) Filed: Feb. 27, 2018

(65) Prior Publication Data

US 2019/0088316 A1  Mar. 21, 2019

(30) Foreign Application Priority Data

Sep. 19, 2017 (JP) .................. 2017-178874

(51) Int. Cl.
*G11C 13/00* (2006.01)
*H01L 27/24* (2006.01)
*H01L 45/00* (2006.01)

(52) U.S. Cl.
CPC ........ *G11C 13/003* (2013.01); *G11C 13/0023* (2013.01); *H01L 27/249* (2013.01); *H01L 27/2454* (2013.01); *H01L 45/04* (2013.01); *H01L 45/06* (2013.01); *H01L 45/1233* (2013.01); *H01L 45/144* (2013.01); *H01L 45/146* (2013.01); *H01L 45/148* (2013.01); *G11C 13/004* (2013.01); *G11C 13/0004* (2013.01); *G11C 13/0038* (2013.01); *G11C 2213/71* (2013.01); *G11C 2213/79* (2013.01); *H01L 27/2481* (2013.01)

(58) Field of Classification Search
CPC .............. G11C 13/003; G11C 13/0023; G11C 13/0004; G11C 13/0038; G11C 13/004; G11C 2213/71; G11C 2213/79; H01L 27/2454; H01L 27/2481
USPC ......................................... 365/148
See application file for complete search history.

(56) References Cited

U.S. PATENT DOCUMENTS

| 7,439,782 | B2 * | 10/2008 | Kamoshida | ............ | G11C 5/143 |
| | | | | | 327/143 |
| 8,315,103 | B2 | 11/2012 | Lee et al. | | |
| 8,711,634 | B2 | 4/2014 | Futatsuyama et al. | | |
| 8,760,925 | B2 | 6/2014 | Li | | |
| 9,685,452 | B2 | 6/2017 | Lee et al. | | |
| 9,711,229 | B1 * | 7/2017 | Rabkin | .................. | G11C 16/16 |

(Continued)

*Primary Examiner* — Sung Il Cho
(74) *Attorney, Agent, or Firm* — Kim & Stewart LLP

(57) ABSTRACT

A resistance change type memory device includes a first memory cell at a crossing of a first bit line and a first word line, a second memory cell at a crossing of a second bit line and a second word line, a first selection gate line connected to the first bit line, a second selection gate line connected to the second bit line, a dummy gate line adjacent to the first selection gate line, and a control circuit configured to apply a first voltage to the first selection gate line and a second voltage smaller than the first voltage to the dummy gate line when the first selection gate line is selected, and the second voltage or a third voltage smaller than the second voltage to the first selection gate line and the third voltage to the dummy gate line when the second selection gate line is selected.

20 Claims, 17 Drawing Sheets

(56) References Cited

U.S. PATENT DOCUMENTS

| | | | |
|---|---|---|---|
| 9,905,307 B1* | 2/2018 | Ghai | G11C 16/3495 |
| 2003/0156448 A1* | 8/2003 | Hidaka | G11C 8/08 |
| | | | 365/171 |
| 2012/0069628 A1* | 3/2012 | Ito | G11C 13/0002 |
| | | | 365/148 |
| 2015/0255515 A1* | 9/2015 | Nakai | H01L 27/2481 |
| | | | 365/148 |
| 2016/0020389 A1* | 1/2016 | Ratnam | G11C 13/004 |
| | | | 257/2 |

* cited by examiner

RESISTANCE CHANGE TYPE MEMORY

CROSS-REFERENCE TO RELATED APPLICATION

This application is based upon and claims the benefit of priority from Japanese Patent Application No. 2017-178874, filed, Sep. 19, 2017, the entire contents of which are incorporated herein by reference.

FIELD

Embodiments described herein relate generally to a resistance change type memory.

BACKGROUND

As a new type of memory device, development and research in resistance change type memory, such as a ReRAM and a PCRAM, are being carried out. These types of memory devices are also known as variable resistance memory devices.

DETAILED DESCRIPTION

Figure 1:
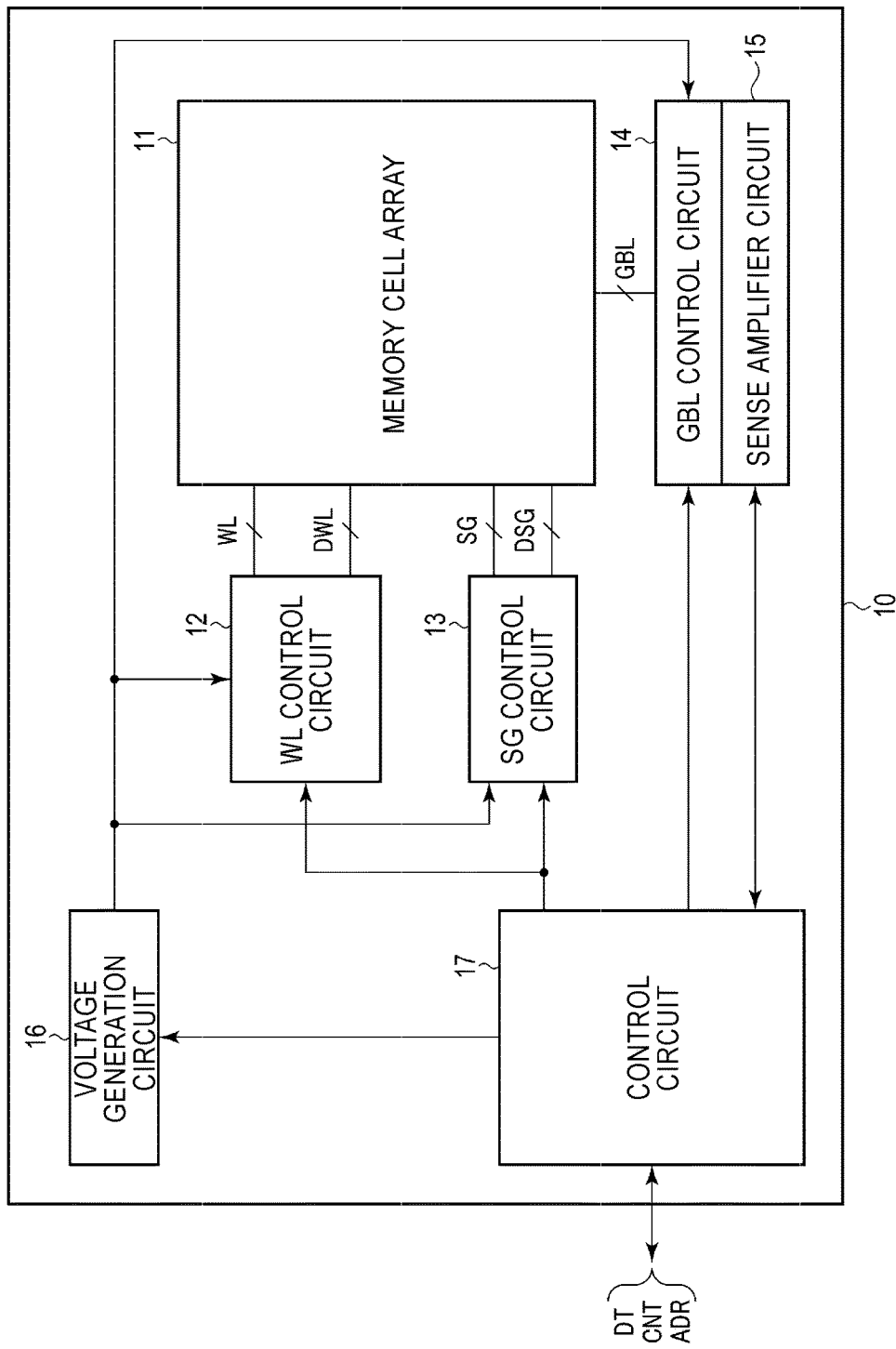
FIG. 1 is a block diagram of a resistance change type memory according to a first embodiment.

A resistance change type memory device includes a first bit line and a second bit line extending in parallel along a first direction perpendicular to a surface of a substrate, the first and the second bit lines being spaced from each other in a second direction parallel to the surface of the substrate, a first word line and a second word line extending in parallel along a third direction parallel to the surface of the substrate, a first memory cell at a crossing of the first bit line and the first word line, a second memory cell at a crossing of the second bit line and the second word line, a first selection transistor between the first bit line and the substrate in the first direction, the first selection transistor having a first channel portion and a first gate portion connected to a first selection gate line, a second selection transistor between the second bit line and the substrate in the first direction, the second selection transistor having a second channel portion and a second gate portion connected to a second selection gate line, a third selection transistor connected to a dummy selection gate line, the dummy selection gate line being adjacent to the first selection gate line in the second direction and having a third gate portion, and a control circuit configured to apply when the first selection gate line is selected, a first voltage to the first selection gate line, and a second voltage to the dummy selection gate line, the second voltage being smaller than the first voltage, and when the second selection gate line is selected, the first voltage to the second selection gate line, the second voltage or a third voltage to the first selection gate line, and the third voltage to the dummy selection gate line, the third voltage being equal to or smaller than the second voltage.

A resistance change type memory according to example embodiments will be described with reference to FIGS. 1 to 17.

Hereinafter, the examples will be described in detail with reference to the drawings. In the following description, the same reference numerals will be given to elements having the same functions and configurations.

In addition, in the following description, when it is not necessary to individually distinguish between components or aspects included in multiple instances (e.g., word lines WL, a bit lines BL, various voltages and signals, and the like) that may be designated by reference labels followed by additional numerals/letters from each other, then these components or aspects will be referred by just the main reference label without the additional numerals/letters otherwise appended when an individual or particular instances of the component/aspect are being referenced for description.

(1) First Embodiment

A configuration and operation of a resistance change type memory of a first embodiment will be described with reference to FIGS. 1 to 12.

(a) Configuration Example

A configuration example of the resistance change type memory of the first embodiment will be described with reference to FIGS. 1 to 8.

FIG. 1 is a block diagram of a configuration example of the resistance change type memory according to the first embodiment.

As illustrated in FIG. 1, the resistance change type memory according to the first embodiment includes a memory cell array 11, a word line control circuit 12, a selection gate line control circuit 13, a global bit line control circuit 14, a sense amplifier circuit 15, a voltage generation circuit 16, and a control circuit 17.

The memory cell array 11 includes a plurality of memory cells, a plurality of word lines WL, a plurality of bit lines BL (see FIG. 3), a plurality of selection gate lines SG, and a plurality of global bit lines GBL.

The memory cells are connected to the word lines WL and the bit lines BL. The bit lines BL are connected to the global bit lines GBL via the current path of selection transistors. The gates of the selection transistors are connected to the selection gate lines SG.

The memory cell array 11 includes a dummy word line DWL and a dummy selection gate line DSG.

The word line control circuit 12 controls the plurality of word lines WL. The word line control circuit 12 controls activation and deactivation of the plurality of word lines WL. The word line control circuit 12 controls the potential of the word lines WL. Thus, the word line control circuit 12 may set a predetermined memory cell to a selection state with respect to a row of the memory cell array 11.

The word line control circuit 12 controls the potential of the dummy word line DWL.

For example, the word line control circuit 12 includes a word line decode circuit, a word line driver, and the like.

The selection gate line (SG) control circuit 13 controls the plurality of selection gate lines SG. The selection gate line control circuit 13 controls the potential of the selection gate lines SG. The selection gate line control circuit 13 may electrically connect a predetermined bit line BL to a predetermined global bit line GBL by controlling activation and deactivation of the plurality of selection gate lines SG.

The selection gate line control circuit 13 may control the potential of the dummy selection gate line DSG.

The selection gate line control circuit 13 includes a selection gate line decode circuit, and the like.

The global bit line (GBL) control circuit 14 controls the plurality of global bit lines GBL. The global bit line control circuit 14 controls the potential of the global bit lines GBL. The global bit line control circuit 14 controls activation and deactivation of the plurality of global bit lines GBL. Thus, the global bit line control circuit 14 may set a predetermined memory cell to a selection state with respect to a column of the memory cell array 11.

The global bit line control circuit 14 includes a global bit line decode circuit, a global bit line driver, and the like.

The sense amplifier circuit 15 reads data from the memory cell array 11.

For example, during a read operation, an output signal of the memory cell in the selection state is output to the global bit line GBL. The sense amplifier circuit 15 senses the signal on the global bit line GBL and amplifies the sensed signal. The sense amplifier circuit 15 discriminates data held by the memory cell based on the acquired signal.

For example, the sense amplifier circuit 15 may have a buffer circuit having a buffer function.

The sense amplifier circuit 15 may be driven to control the potentials of the global bit line GBL and the bit line during a write operation.

The voltage generation circuit 16 generates various voltages for a write operation, a read operation, and an erasing operation with respect to the memory cell array 11. The voltage generation circuit 16 supplies the generated various voltages to the word line control circuit 12, the selection gate line control circuit 13, the global bit line control circuit 14, and the like.

The control circuit 17 controls operations of the other circuits 12 to 16 depending on an operation of the resistance change type memory 10. The control circuit 17 includes, for example, a logic control circuit, an input/output (I/O) circuit, a decode circuit, a register circuit, and the like.

The control circuit 17 receives a control signal CNT and an address ADR from a memory controller (not specifically illustrated). Data DT is transmitted between the control circuit 17 and the memory controller.

The control circuit 17 executes an operation with respect to the memory cell array 11 based on the control signal and command CNT.

The control circuit 17 supplies the address ADR or the decode result of the address to the word line control circuit 12, the selection gate line control circuit 13, and the global bit line control circuit 14. Based on the decode result of address ADR, the word line control circuit 12, the selection gate line control circuit 13, and the global bit line control circuit 14 control activation and deactivation of the word lines WL, the selection gate lines SG, and the global bit lines GBL of the memory cell array 11.

During the write operation, the data DT is written in a selected memory cell. During the read operation, data read from the memory cell is transmitted to the memory controller.

Figure 2:
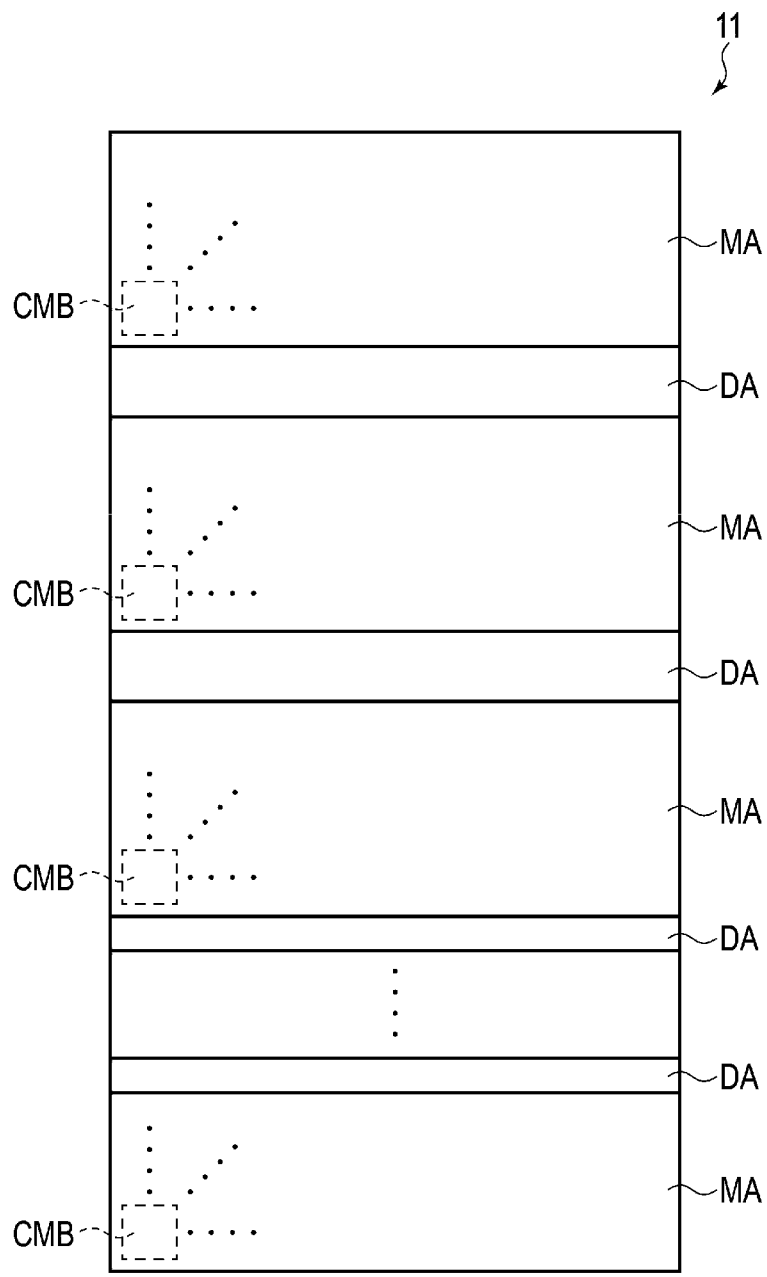
FIG. 2 is a diagram of a memory cell array in a resistance change type memory according to the first embodiment.

FIG. 2 is a diagram of an example layout of the memory cell array of the resistance change type memory according to the first embodiment.

As illustrated in FIG. 2, the memory cell array 11 includes a plurality of memory areas MA. Each memory area MA is an area including at least a memory cell, a selection transistor, a word line BL, a bit line WL, a global bit line GBL, and a selection gate line.

The memory area MA includes a plurality of control units CMB (also referred to as selection units or blocks in some instances).

For example, during an operation with respect to the memory cell array 11, one of the plurality of control units CMB is selected, and a predetermined operation is executed with respect to the selected control unit CMB.

The memory cell array 11 includes a plurality of dummy areas DA. Each dummy area DA is disposed between two adjacent memory areas MA.

The dummy areas DA are areas each including at least a dummy cell, a dummy selection transistor, a dummy word line DWL, a dummy bit line DBL, and a dummy selection gate line DSG.

Figure 3:
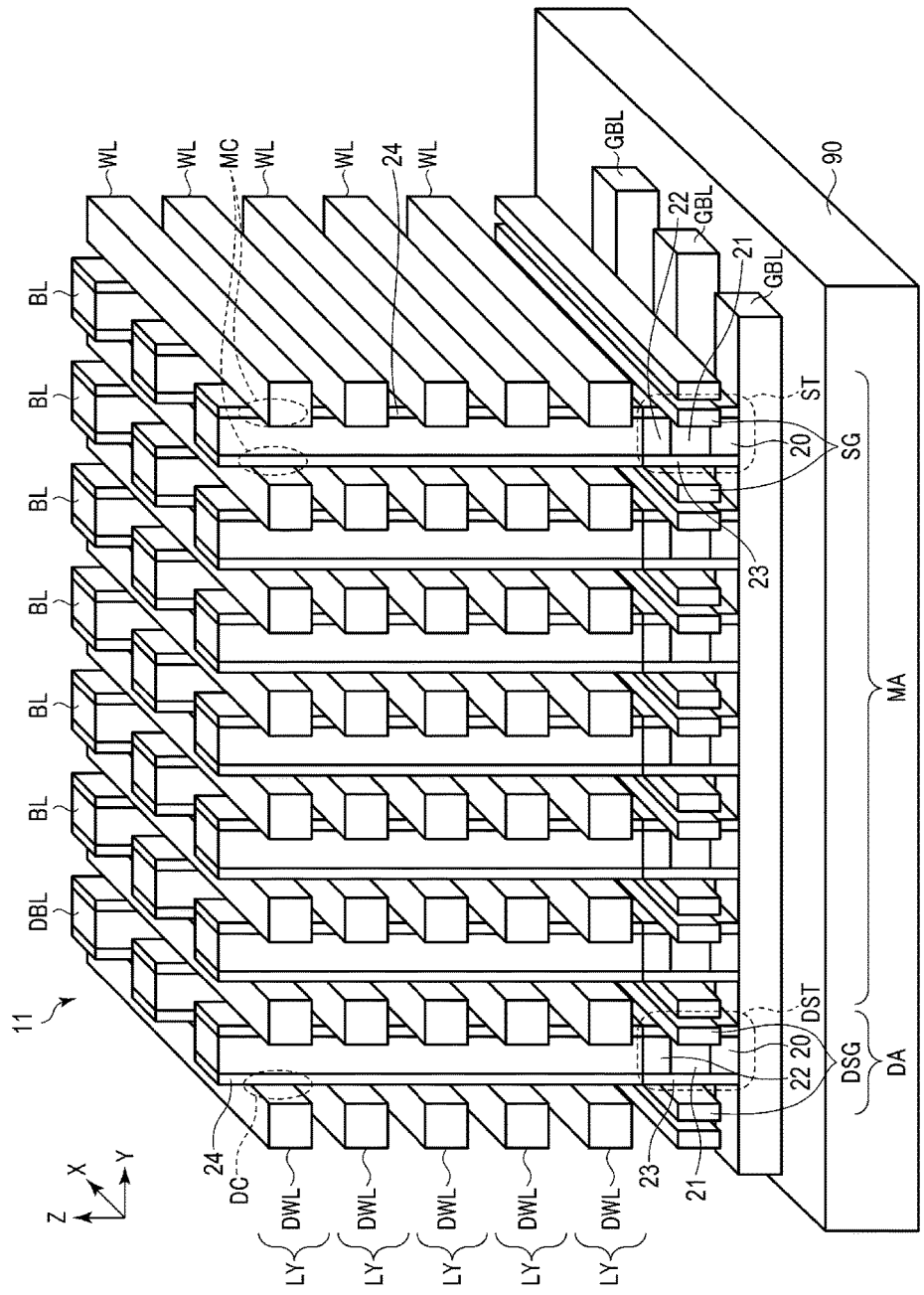
FIG. 3 is a perspective view of a memory cell array in a resistance change type memory according to the first embodiment.

FIG. 3 is a perspective view of an example structure of the memory cell array of the resistance change type memory according to the first embodiment.

As illustrated in FIG. 3, the memory cell array 11 has a three-dimensional structure.

The bit lines BL extend in the Z direction. The Z direction is a direction perpendicular to the surface of a substrate (also referred to as a chip) 90. The bit lines BL having a vertical structure are arranged in a matrix form in the X-Y plane of the substrate 90.

The word lines WL extend in the X direction. The X direction is a direction parallel to the surface of the substrate 90. An insulating layer (not specifically illustrated) is provided between adjacent word lines WL in the Z direction.

The global bit lines GBL extend in the Y direction. The Y direction is a direction parallel to the surface of the substrate 90. The Y direction intersects with the X direction.

A plurality of layers LY is stacked in the Z direction. In each layer LY, a plurality of memory cells MC are arranged along the X direction and the Y direction. The memory cells MC are stacked in the Z direction.

The bit lines BL extend over a plurality of layers LY. In each layer LY, the bit lines BL intersect with the plurality of word lines WL arranged in the Z direction.

A memory film 24 is provided between a bit line BL and word lines WL. For example, the memory film 24 is continuous in the Z direction along the side surface of the bit line BL which faces the word lines WL. A portion of the memory film 24 between a bit line BL and a word line WL functions as a memory cell MC. For example, the memory cell MC is a variable resistance element or a phase change element.

The memory film 24 is a resistance change film. For example, a stacked film of a chalcogenide-based material (e.g., GeSbTe), a transition metal oxide (e.g., titanium oxide), a semiconductor (e.g., a-Si), and a transition metal oxide, or the like is used in the memory film 24.

The resistance value of the resistance change film as the memory film 24 can be changed reversibly by a voltage and current applied to the film, heat generated by the voltage and current, and the like. The changed resistance value of the resistance change film is substantially maintained until a predetermined voltage/current is applied again. The resistance change film as the memory film 24 may have two or more resistance values. Thus, the variable resistance value of the memory cell MC is associated with data of 1 bit or more.

Due to such properties of the resistance change film 24, the memory cell MC may store the data DT substantially in a nonvolatile manner.

For example, in the first embodiment, the low resistance state of the memory cell MC in the memory film 24 is referred to as a set state, and the high resistance state of the memory cell MC is referred to as a reset state. An operation of bringing the resistance state of the memory cell MC into the set state is referred to as a set operation, and an operation of bringing the resistance state of the memory cell MC into the reset state is referred to as a reset operation.

In the memory area MA, a plurality of selection transistors ST is provided below the memory cells MC. The plurality of selection transistors ST is two-dimensionally arranged above the substrate 90.

Each selection transistor ST is provided between a bit line BL and a global bit line GBL.

The selection transistor ST is a vertical thin film transistor (TFT). The current path of the selection transistor ST extends in the Z direction perpendicular to the substrate surface.

The selection transistor ST includes a columnar semiconductor layer (also referred to as a body portion or a channel portion) 21. Sources/drains (also referred to as diffusion layers or gate portions) 20 and 22 of the selection transistor ST are aligned in the Z direction. One source/drain is provided between the global bit line GBL and the semiconductor layer 21. The other source/drain 22 is provided between the semiconductor layer 21 and the bit line BL.

The source/drain 20 of the selection transistor ST is connected to the global bit line GBL. The source/drain 22 of the selection transistor ST is connected to the bit line BL.

The current paths 20, 21 and 22 of the selection transistor ST are independent for each bit line BL. The selection transistors ST correspond to the bit lines BL in a one-to-one basis.

The gate structure of the selection transistor ST may have a double gate structure.

A conductive layer SG faces the side surface of the semiconductor layer 21 in the Y direction with a gate insulating film 23 interposed therebetween. The conductive layer SG is a gate electrode of the selection transistor ST. The gate electrode SG of the selection transistor ST extends in the X direction. The selection transistors ST arranged in the X direction share the gate electrode SG. The gate electrode SG is used as the selection gate line SG. For example, two conductive layers SG having one semiconductor layer 21 sandwiched therebetween function as one selection gate line SG.

Two selection transistors ST, which are adjacent in the Y direction, are connected to different selection gate lines SG, respectively.

In the two selection transistors ST adjacent in the Y direction, an insulating layer (not specifically illustrated) is provided between the conductive layers (also referred to as selection gate lines) SG.

A dummy area DA is adjacent to a memory area MA.

The structure in the dummy area DA is substantially the same as the structure in the memory area MA. A memory cell (dummy cell) in the dummy area DA is not used as a storage element of user data.

A plurality of dummy cells DC is arranged in the dummy area DA at least in the Z direction and the X direction. A memory film 24 is provided between a dummy word line DWL and a dummy bit line DBL. The dummy cells DC are provided at positions at which the dummy word lines DWL and the dummy bit lines DBL intersect. For example, the dummy word lines DWL are electrically separated from the word lines WL.

The global bit lines GBL extends over the dummy area DA and the memory area MA. In the dummy area DA, a dummy selection transistor DST is provided between a dummy bit line DBL and a global bit line GBL.

In the dummy area DA, the gate of the dummy selection transistor DST is connected to the dummy selection gate line DSG.

Figure 4:
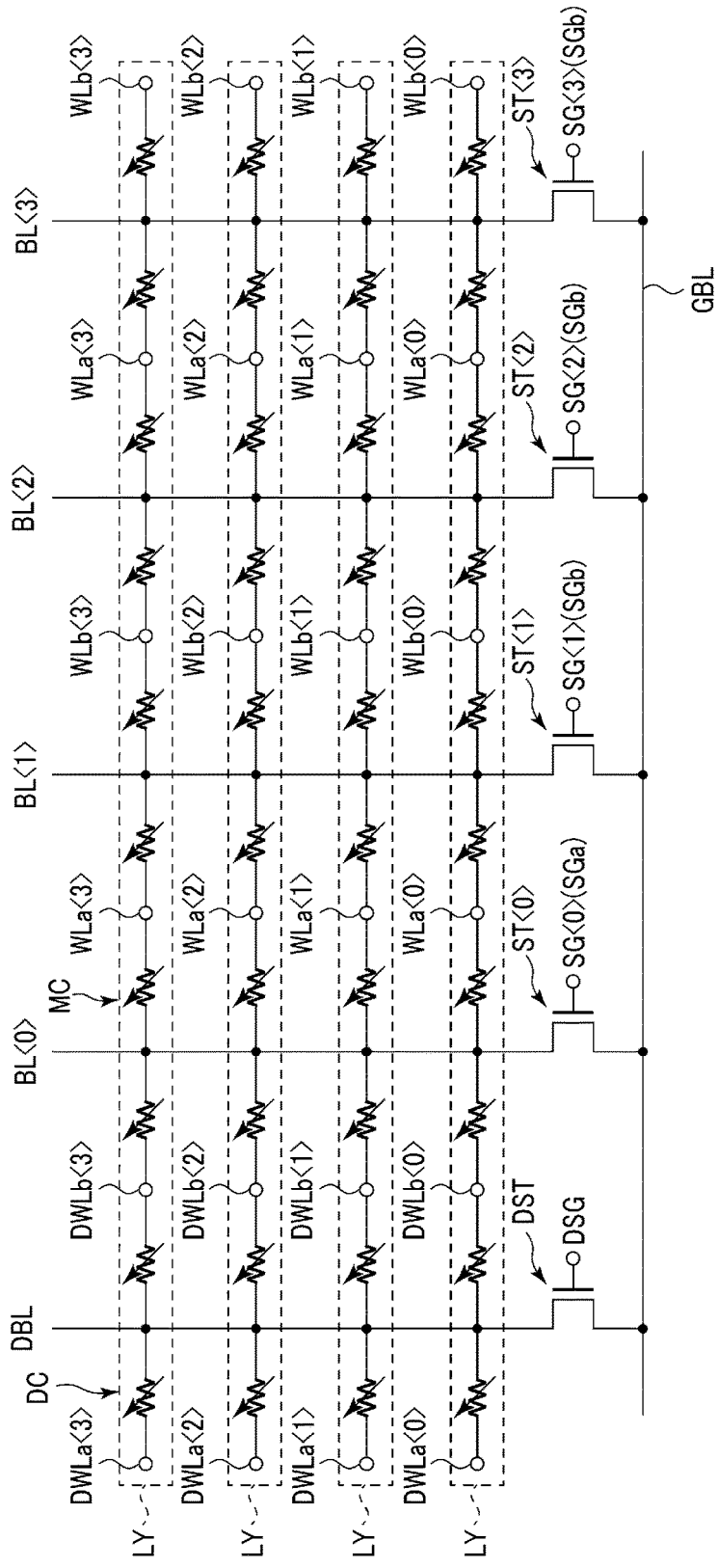
FIG. 4 is a circuit diagram of a memory cell array in a resistance change type memory according to the first embodiment.

FIG. 4 is an equivalent circuit diagram of the memory cell array in the resistance change type memory according to the first embodiment. In FIG. 4, with respect to a plurality of bit lines BL connected to one global bit line GBL, four layers LY in the memory cell array 11 are extracted and illustrated.

A plurality of word lines WLa (WLa<0>, WLa<1>, WLa<2>, and WLa<3>) and WLb (WLb<0>, WLb<1>, WLb<2>, and WLb<3>) is formed in the respective layers LY of the memory cell array 11 (e.g., the control unit CMB).

The plurality of word lines WLa is electrically separated for each layer LY. The plurality of word lines WLb is electrically separated for each layer LY. In each layer LY, a word line WLa (e.g., a word line WLa<3>) is electrically separated from a word line WLb (e.g., a word line WLb<3>).

The bit lines BL (BL<0>, BL<1>, BL<2>, and BL<3>) extend over the plurality of layers LY.

One end of a memory cell MC is connected to one word line WL (WLa or WLb), and the other end of the memory cell MC is connected to one bit line BL.

In a plurality of memory cells (e.g., variable resistance elements) MC located in the same layer LY, two memory cells MC connected to the same bit line BL, are connected to different word lines WLa and WLb, respectively.

A plurality of memory cells MC connected to the same word line WLa (or the same word line WLb) is connected to different bit lines BL, respectively.

The plurality of bit lines BL is each connected to one end of the current path of the respective selection transistor ST (ST<0>, ST<1>, ST<2>, and ST<3>). The other end of the current path of the respective selection transistor ST is connected to the global bit line GBL.

The gates of the respective selection transistors ST are connected to different selection gate lines SG (SG<0>, SG<1>, SG<2>, and SG<3>), respectively.

A plurality of dummy word lines DWLa (DWLa<0>, DWLa<1>, DWLa<2>, and DWLa<3>) and DWLb (DWLb<0>, DWLb<1>, DWLb<2>, and DWLb<3>) is provided in the respective layers LY in the dummy area DA.

The bit line BL<0> is connected to the global bit line GBL via the current path of the selection transistor ST<0>. The selection transistor ST<0> is provided at an end of the memory area MA in the vicinity of the boundary between the memory area MA and the dummy area DA. The gate of the selection transistor ST<0> is connected to the selection gate line SG<0>(SGa).

The bit line BL<1> is connected to the global bit line GBL via the current path of the selection transistor ST<1>. The selection transistor ST<1> is adjacent to the selection transistor ST<0> on the side opposite to the boundary between the memory area MA and the dummy area DA. The gate of the selection transistor ST<1> is connected to the selection gate line SG<1>(SGb). The selection gate line SG<b> is adjacent to the selection gate line SG<0>.

The dummy cell DC in the dummy area DA is connected to the dummy bit line DBL.

In each layer LY, two dummy cells DC are connected to one dummy bit line DBL. In the two dummy cells DC connected to the same dummy bit line DBL in one layer LY, one dummy cell DC is connected to one dummy word line DWLa and the other dummy cell DC is connected to the dummy word line DWLb.

The dummy bit line DBL is connected to one end of the current path of the dummy selection transistor DST. The other end of the current path of the dummy selection transistor DST is connected to the global bit line GBL.

The gate of the dummy selection transistor DST is connected to the dummy selection gate line DSG.

At the boundary portion between the memory area MA and the dummy area DA, one selection gate line SG<0> among the plurality of selection gate lines SG is adjacent to the dummy selection gate line DSG.

Hereinafter, among the plurality of selection gate lines SG, the selection gate line adjacent to the dummy selection gate line DSG is denoted by a selection gate line SGa. Among the plurality of selection gate lines, the selection gate line not adjacent to the dummy selection gate line DSG is denoted by a selection gate line SGb.

The selection gate line SGa is disposed at the end of the memory area MA in the Y direction. Hereinafter, for clearly distinguishing components, the selection gate line SGa adjacent to the dummy selection gate line DSG will also be referred to as an end selection gate line SGa.

Figure 5:
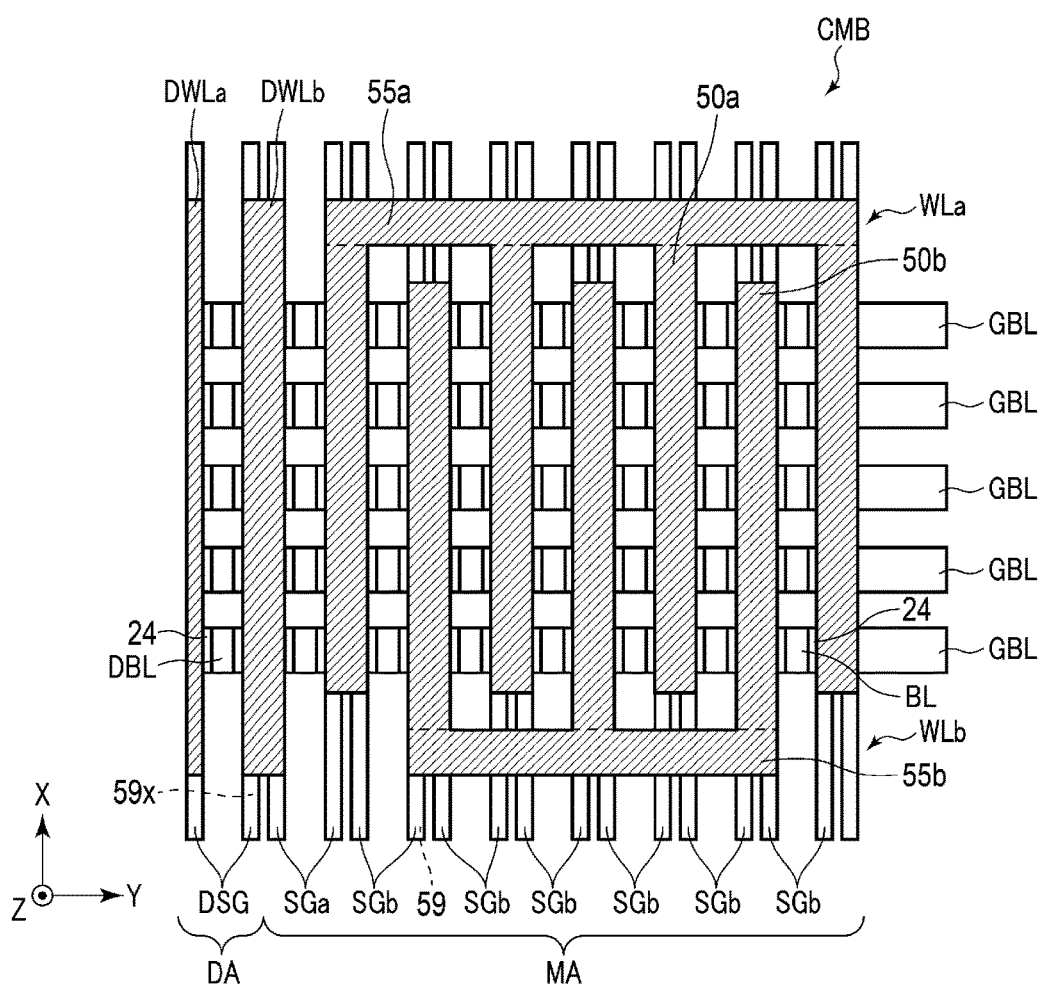
FIG. 5 is a plan view of a memory cell array in a resistance change type memory according to the first embodiment.

FIG. 5 is a plan view of a structural example of the memory cell array in the resistance change type memory according to the first embodiment. In FIG. 5, a portion of one layer of the control unit CMB of the memory cell array is extracted and illustrated.

Figure 6:
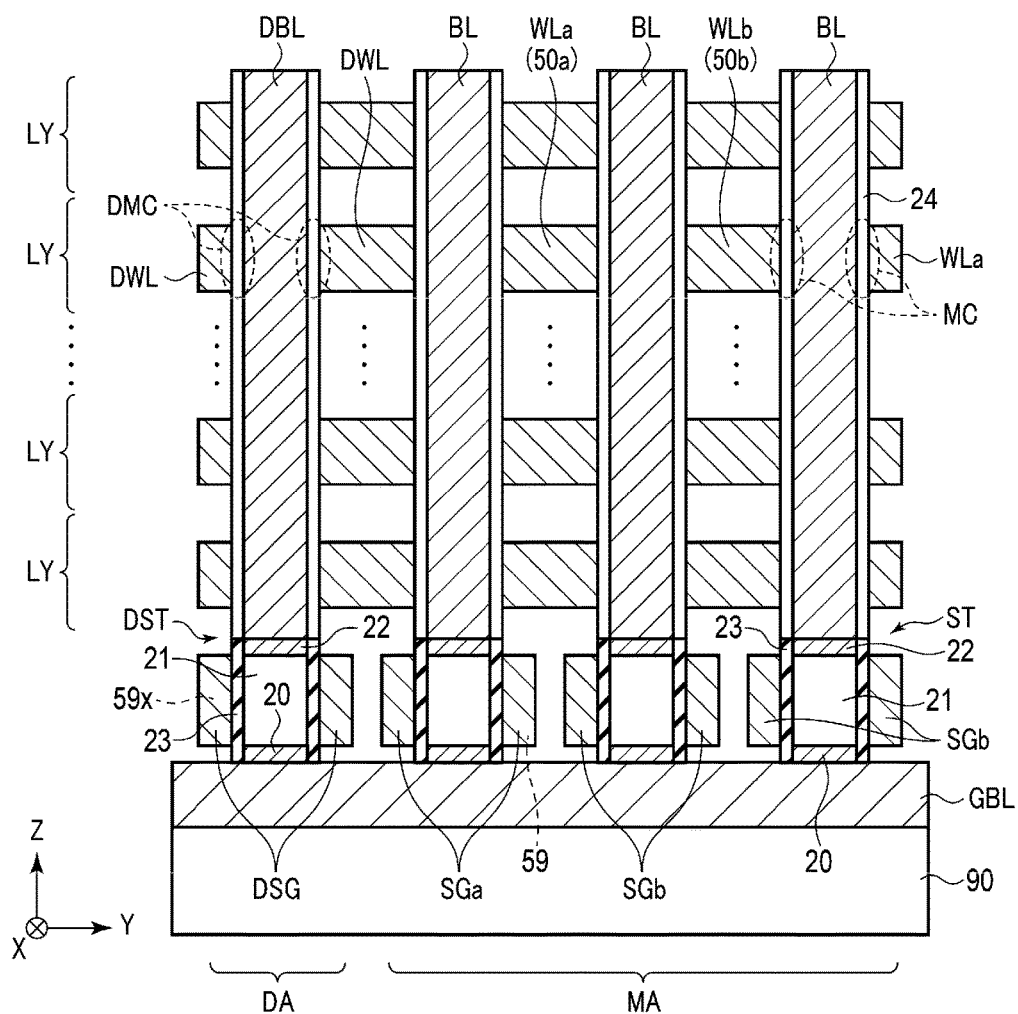
FIG. 6 is a cross-sectional view of the memory cell array in a resistance change type memory according to the first embodiment.

FIG. 6 is a cross-sectional view of a structural example of the memory cell array in the resistance change type memory according to the first embodiment.

As illustrated in FIGS. 5 and 6, with respect to one layer LY of the control unit (hereinafter, also referred to as a block or a comb) CMB, two word lines WLa and WLb are provided in the memory area MA. In the layer LY, the word line WLa is separated from the word line WLb.

Each word line WL (WLa or WLb) is a conductive layer having a comb shape in a plan view.

The comb tooth portions 50 (50a and 50b) (hereinafter, referred to as fingers) of the word lines WL having the comb shape extend in the X direction.

The plurality of fingers 50 are connected to a comb shaft portion 55 (55a or 55b) (hereinafter, referred to as a shaft portion) of the conductive layer having the comb shape. The shaft portion 55 extends in the Y direction.

The fingers 50a of the word line WLa are disposed between the fingers 50b of the word line WLb. The shaft portion 55a of the word line WLa is provided on one end side of the memory area MA in the X direction. The shaft portion 55b of the word line WLb is provided on the other end side of the memory area MA in the X direction.

One finger 50 is provided between bit lines BL, which are arranged side by side in the Y direction. The finger 50 faces the side surface of each bit line BL in the Y direction. The memory films 24 are provided between the bit lines BL and the finger 50.

A selection gate line SG is provided at a position at which it vertically overlaps a finger 50 in the Z direction. Two conductive layers 59 as the selection gate lines SG are formed below one finger 50. The two conductive layers 59 below one finger 50 are different selection gate lines SG.

Two dummy word lines DWLb and DWLa are provided in the dummy area DA. The dummy word line DWLa may be connected to the dummy word line DWLb.

The dummy selection gate line DSG includes two conductive layers 59x. One conductive layer 59x is formed below the dummy word line DWLa in the Z direction. The other conductive layer 59x is formed below the dummy word line DWLb in the Z direction.

At the boundary portion between the memory area MA and the dummy area DA, the dummy selection gate line DSG is adjacent to the end selection gate line SGa with an insulating layer (not specifically illustrated) interposed therebetween.

As described below, the resistance change type memory according to the first embodiment may prevent dielectric breakdown between the dummy selection gate lines DSG and the selection gate line SGa, which are adjacent to each other, due to the potential difference between the dummy selection gate line DSG and the selection gate line SGa.

<Circuit Configuration>

A circuit configuration of the resistance change type memory of the present embodiment will be described with reference to FIGS. 7 and 8.

Figure 7:
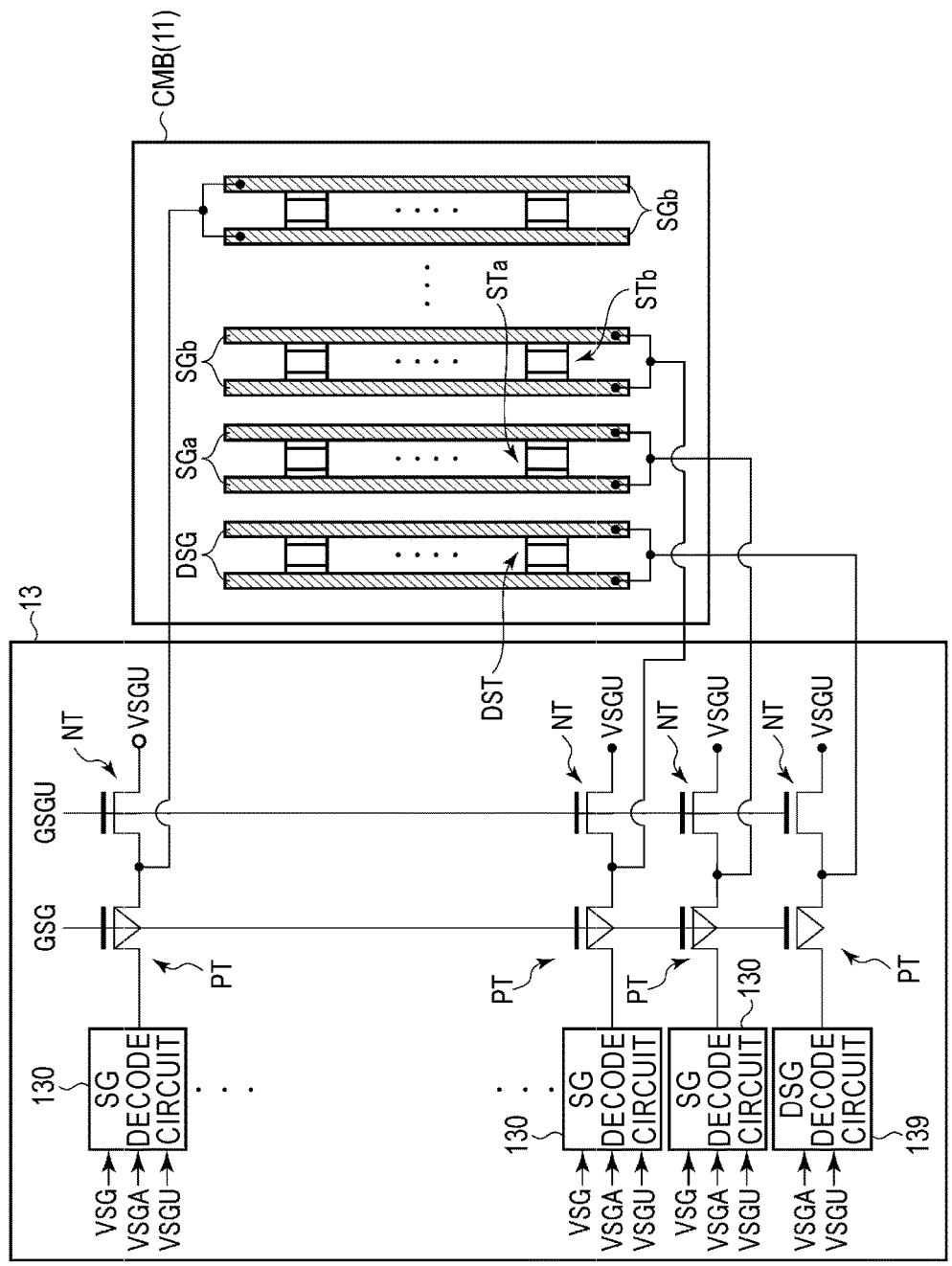
FIG. 7 is a schematic diagram of a resistance change type memory according to the first embodiment.

FIG. 7 is a schematic diagram of the selection gate line of the resistance change type memory according to the first embodiment.

In FIG. 7, for the clarity of description, in the block CMB in the memory cell array 11, only the layer in which the selection gate lines SG are disposed is illustrated.

As illustrated in FIG. 7, the selection gate line control circuit 13 includes a plurality of selection gate line decode circuits 130 and at least one dummy selection gate line decode circuit 139.

The plurality of selection gate line decode circuits 130 corresponds to the selection gate lines SG in the block CMB in a one-to-one basis. One selection gate line decode circuit 130 is connected to the corresponding selection gate line SG.

The dummy selection gate line decode circuit 139 is connected to the dummy selection gate line DSG in the block CMB.

A plurality of P-type transistors (e.g., FETs) PT are provided in the selection gate line control circuit 13 so as to correspond to the selection gate lines SG and the dummy selection gate line DSG in a one-to-one basis.

The P-type transistors PT control the electrical connection between the selection gate line decode circuits 130 and the selection gate lines SG and the electrical connection between the dummy selection gate line decode circuit 139 and the dummy selection gate line DSG by a signal GSG.

The gates of the plurality of P-type transistors PT are connected to a common wiring. The signal GSG is supplied to the gates of the plurality of P-type transistors PT. The ON/OFF of the plurality of P-type transistors is collectively controlled depending on the signal level of the signal GSG.

Each selection gate line decode circuit 130 is connected to the corresponding selection gate line SG (SGa or SGb) via the current path of the corresponding P-type transistor PT.

The dummy selection gate line decode circuit 139 is connected to the dummy selection gate line DSG via the current path of the corresponding P-type transistor PT.

When the corresponding block CMB is selected (activated) based on a selection address, the P-type transistor PT is turned on by the signal GSG of the "low (L)" level. By the P-type transistor PT in the ON state, the selection gate line decode circuit 130 is connected to the selection gate line SG and the dummy selection gate line decode circuit 139 is connected to the dummy selection gate line DSG.

When the corresponding block CMB is not selected (deactivated), the P-type transistors PT are turned off by the signal GSG of the "high (H)" level. By the P-type transistors PT in the OFF state, the selection gate line decode circuits 130 are electrically separated from the selection gate lines SG, and the dummy selection gate line decode circuit 139 is electrically separated from the dummy selection gate line DSG.

A plurality of N-type transistors (e.g., FETs) NT is provided in the selection gate line control circuit 13 so as to correspond to the selection gate lines SG and the dummy selection gate line DSG in a one-to-one basis.

The N-type transistors NT supply a non-selection voltage VSGU to the selection gate lines SG and the dummy selection gate line DSG by a signal GSGU. Hereinafter, a terminal to which the voltage VSGU is applied is denoted by a voltage terminal VSGU.

The gates of the plurality of N-type transistors NT are connected to a common wiring. The signal GSGU is supplied to the gates of the plurality of N-type transistors NT. The ON/OFF of the plurality of N-type transistors NT is collectively controlled depending on the signal level of the signal GSGU.

Each of the selection gate lines SG and the dummy selection gate line DSG is connected to the voltage terminal VSGU via the corresponding N-type transistor NT.

When the corresponding block CMB is selected (activated) based on a selection address, the N-type transistors NT are turned off by the signal GSGU of the "L" level. By the N-type transistors NT in the OFF state, the selection gate lines SG and the dummy selection gate line DSG are electrically separated from the voltage terminal VSGU.

When the corresponding block CMB is not selected (deactivated), the N-type transistors NT are turned on by the signal GSGU of the "H" level. By the N-type transistors NT in the ON state, the voltage terminal VSGU is electrically connected to the selection gate lines SG and the dummy selection gate line DSG.

The selection gate line decode circuit 130 may supply one of a plurality of voltages VSG, VSGA and VSGU to the selection gate lines SG based on a selection address of an operation object.

The selection gate line decode circuit 130 supplies a selection voltage VSG to the corresponding selection gate line SG, that is a selected selection gate line SG, when the corresponding selection gate line SG is selected.

When another selection gate line adjacent to the corresponding selection gate line SG is selected, the selection gate line decode circuit 130 supplies a first non-selection voltage VSGA to the corresponding unselected selection gate line SG.

When the corresponding selection gate line is not selected and the corresponding selection gate line is not adjacent to the selected selection gate line, the selection gate line decode circuit 130 supplies a second non-selection voltage VSGU to the unselected corresponding selection gate line SG.

The voltage value of the selection voltage VSG is higher than the voltage value of the first non-selection voltage VSGA. The voltage value of the first non-selection voltage VSGA is higher than the voltage value of the second non-selection voltage VSGU. However, the voltage value of the second non-selection voltage VSGU may be substantially the same as the voltage value of the first non-selection voltage VSGA according to an operation executed by the resistance change type memory.

In the resistance change type memory according to the first embodiment, the dummy selection gate line decode circuit 139 may supply one of the plurality of voltages VSGA and VSGU to the dummy selection gate line DSG based on a selected address of an operation object in the memory area MA.

When the selection gate line SGa adjacent to the dummy selection gate line DSG is selected, the dummy selection gate line decode circuit 139 applies the first non-selection voltage VSGA (<VSG) to the dummy selection gate line DSG.

When the selection gate line SGa adjacent to the dummy selection gate line DSG is not selected (that is, the selection gate line SGb is selected), the dummy selection gate line decode circuit 139 applies the second non-selection voltage VSGU (<VSGA) to the dummy selection gate line DSG.

Figure 8:
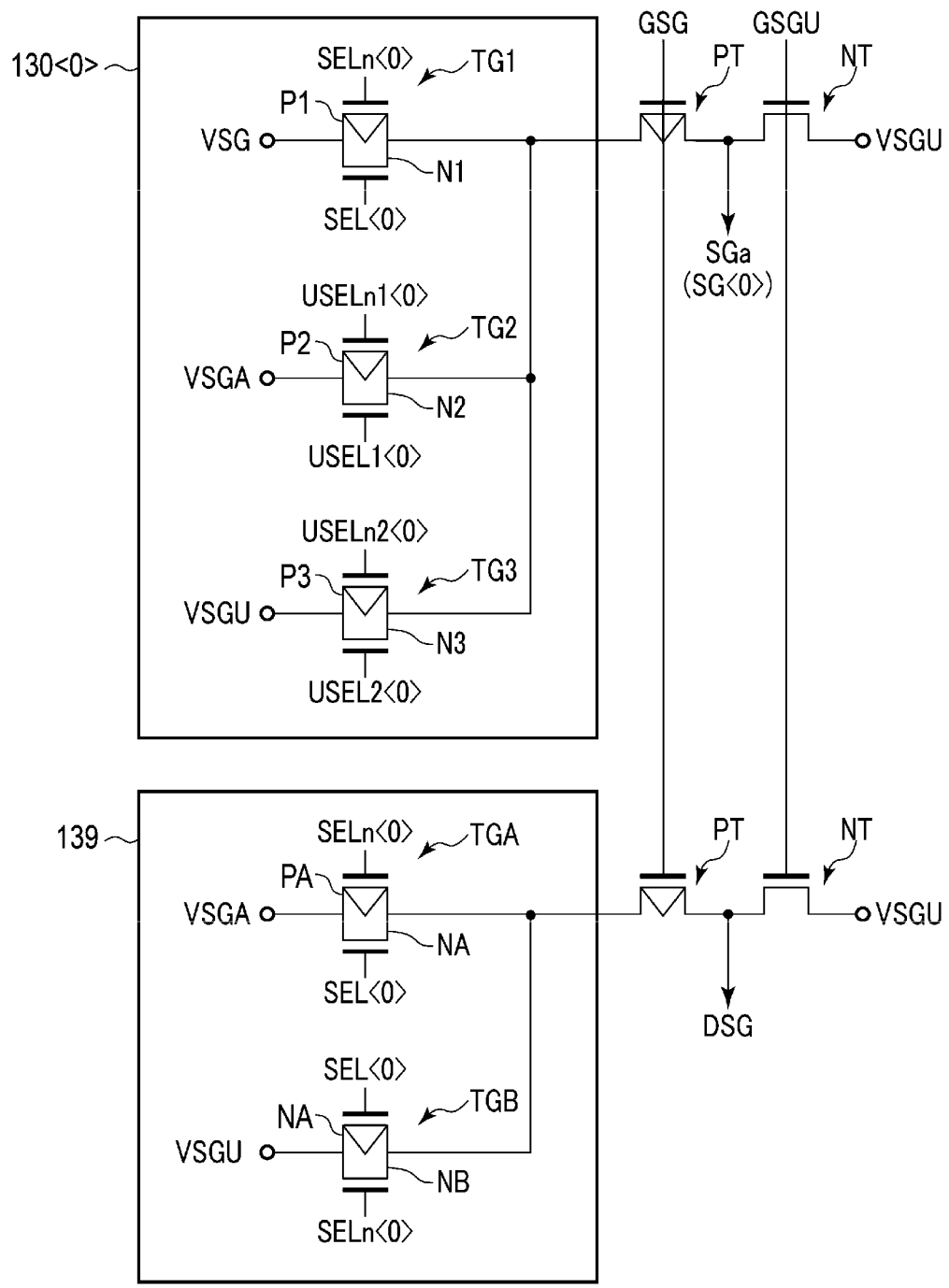
FIG. 8 is a circuit diagram of a resistance change type memory according to the first embodiment.

FIG. 8 is an equivalent circuit diagram of an example internal configuration of the selection gate line control circuit in the resistance change type memory according to the first embodiment.

As illustrated in FIG. 8, the selection gate line decode circuit 130 (130<0>) includes three transfer gates TG1, TG2, and TG3 so as to correspond to three voltages VSG, VSGA, and VSGU.

The selection gate line decode circuit 130 illustrates a circuit corresponding to the end selection gate line SGa (SG<0>). However, an internal configuration of the selection gate line decode circuit 130 is substantially the same in the plurality of selection gate lines SG. However, various control signals SEL, SELn, USEL1, USELn1, USEL2, and USELn2 for controlling activation/deactivation (selection/non-selection) of the selection gate line decode circuit 130 are different for each selection gate line decode circuit 130.

The transfer gate TG1 is connected between a terminal to which the voltage VSG is applied and the P-type transistor PT. The ON/OFF of the transfer gate TG1 is controlled by control signals SEL<0> and SELn<0>. The control signals SEL<0> and SELn<0> are signals generated based on the decode result (decode signal) of an address indicating the corresponding selection gate line SG<0>.

The control signals (selection signals) SEL<0> and SELn<0> are supplied to a control terminal of the transfer gate TG1.

The control signal SEL<0> is supplied to the gate of an N-type transistor N1 of the transfer gate TG1. The control signal SELn<0> is supplied to the gate of a P-type transistor P1 of the transfer gate TG1. The control signal SEL<0> and the control signal SELn<0> have a mutually complementary relationship.

The control signal SEL<0> is set to the "H" level when the selection gate line SG (here, the selection gate line SG<0>) corresponding to the decode circuit 130<0> is selected. The control signal SELn<0> is set to the "L" level when the control signal SEL<0> is set to the "H" level. The control signal SEL<0> is set to the "L" level when the selection gate line SG corresponding to the decode circuit 130<0> is not selected. The control signal SELn<0> is set to the "H" level when the control signal SEL is set to the "L" level.

When the transfer gate TG1 is set to the ON state, the voltage VSG is applied to the selection gate line SG<0>.

The transfer gate TG2 is connected between a terminal to which the voltage VSGA is applied and the P-type transistor PT. The ON/OFF of the transfer gate TG2 is controlled by control signals USEL1<0> and USELn1<0>. For example, the control signals USEL1<0> and USELn1<0> are signals generated based on the decode result of an address indicating the selection gate line SG<1>, which is adjacent to the corresponding selection gate line SG<0>.

The control signals USEL1<0> and USELn1<0> are supplied to a control terminal of the transfer gate TG2.

The control signal USEL1<0> is supplied to the gate of an N-type transistor N2 of the transfer gate TG2. The control signal USELn1<0> is supplied to the gate of a P-type transistor P2 of the transfer gate TG2. The control signal USEL1<0> and the control signal USELn1<0> have a mutually complementary relationship.

When the selection gate line (the selection gate line SG<1> in this case), which is adjacent to the selection gate line SG corresponding to the decode circuit 130<0>, is selected, the control signal USEL1<0> is set to the "H" level. The control signal USELn1<0> is set to the "L" level when the control signal USEL1<0> is set to the "H" level.

The control signal USEL1<0> is set to the "L" level when the selection gate line SG, which corresponds to the decode circuit 130<0>, and the selection gate line, which is adjacent to the corresponding selection gate line SG, are not selected. The control signal USELn1<0> is set to the "H" level when the control signal USEL1<1> is set to the "L" level.

When the transfer gate TG 2 is set to the ON state, the voltage VSGA is applied to the selection gate line SG<0>.

The transfer gate TG3 is connected between a terminal to which the voltage VSGU is applied and the P-type transistor PT. The ON/OFF of the transfer gate TG3 is controlled by control signals USEL2<0> and USELn2<0>. For example, the control signals USEL2<0> and USELn2<0> are signals generated based on the decode result of an address indicating the selection gate line other than the corresponding selection gate line SG<0> and the adjacent selection gate line SG<1>.

The control signals USEL2<0> and USELn2<0> are supplied to a control terminal of the transfer gate TG3.

The control signal USEL2<0> is supplied to the gate of an N-type transistor N3 of the transfer gate TG3. The control signal USELn2<0> is supplied to the gate of a P-type transistor P3 of the transfer gate TG3. The control signal USEL2 and the control signal USELn2 have a mutually complementary relationship.

The control signal USEL2<0> is set to the "H" level when the selection gate line other than the selection gate line SG, which corresponds to the decode circuit 130<0>, and the selection gate line SG, which is adjacent to the corresponding selection gate line, is selected. The control signal USELn2<0> is set to the "L" level when the control signal USEL2<0> is set to the "H" level.

The control signal USEL2<0> is set to the "L" level when the selection gate line SG, which corresponds to the decode circuit 130, or the selection gate line SG, which is adjacent to the corresponding selection gate line, is selected. The control signal USELn2<0> is set to the "H" level when the control signal USELn2<0> is set to the "L" level.

When the transfer gate TG3 is set to the ON state, the voltage VSGU is applied to the selection gate line SG<0>.

In this way, one of the plurality of transfer gates TG1, TG2 and TG 3 is set to the ON state based on a selected address such that a predetermined voltage is applied to the selection gate line SG<1>.

The dummy selection gate line decode circuit 139 includes two transfer gates (MOS switches) TGA and TGB so as to correspond to two voltages VSGA and VSGU.

The transfer gate TGA is connected between a terminal to which the voltage VSGA is applied and the P-type transistor PT. The ON/OFF of the transfer gate TGA is controlled by control signals SEL<0> and SELn<0>.

The control signals SEL<0> and SELn<0> are supplied to a control terminal of the transfer gate TGA. The control signal SEL<0> is supplied to the gate of an N-type transistor NA of the transfer gate TGA. The control signal SELn<0> is supplied to the gate of a P-type transistor PA of the transfer gate TGA. The control signal SEL<0> and the control signal SELn<0> have a mutually complementary relationship.

The control signal SEL<0> is set to the "H" level when the selection gate line (end selection gate line) SGa, which is adjacent to the dummy selection gate line DSG corresponding to the dummy selection gate line decode circuit 139, is selected. The control signal SELn<0> is set to the "L" level when the control signal SEL<0> is set to the "H" level.

The control signal SEL<0> is set to the "L" level when the selection gate line SGa, which is adjacent to the dummy selection gate line DSG, is not selected. The control signal SELn<0> is set to the "H" level when the control signal SEL<0> is set to the "L" level.

When the control signal SEL<0> is at the "H" level, the transfer gate TGA is turned on. When the transfer gate TGA is set to the ON state, the voltage VSGA is applied to the dummy selection gate line DSG.

The transfer gate TGB is connected between a terminal to which the voltage VSGU is applied and the P-type transistor PT. The ON/OFF of the transfer gate TGB are controlled by control signals SEL<0> and SELn<0>.

The control signals SEL<0> and SELn<0> are supplied to a control terminal of the transfer gate TGB. The control signal SELn<0> is supplied to the gate of an N-type transistor NB of the transfer gate TGB. The control signal SEL<0> is supplied to the gate of a P-type transistor PB of the transfer gate TGB.

The control signals SEL<0> and SELn<0> for the transfer gate TGB are the same as the control signals SEL<0> and SELn<0> for the transfer gate TGA. Since the control signal input to each transistor is inverted between the transfer gate TGA and the transfer gate TGB, the transfer gate TGB is not set to the ON state at the same time as the transfer gate TGA.

When the control signal SEL<0> is at the "L" level, the transfer gate TGB is turned on. When the transfer gate TGB is set to the ON state, the voltage VSGU is applied to the dummy selection gate line DSG.

Based on a selected address, one of the plurality of transfer gates TGA and TGB is set to the ON state such that a predetermined voltage is applied to the dummy selection gate line DSG.

In this way, the control signals SEL<0> and SELn<0> for the dummy selection gate line decode circuit 139 are the same as the control signals SEL<0> and SELn<0> for the decode circuit 130 of the selection gate line (end selection gate line) SG<1>, which is adjacent to the dummy selection gate line DSG.

Thus, the control signal for the dummy selection gate line decode circuit 139 is common with the control signal for the decode circuit 130 of the selection gate line SG<1>, which is adjacent to the dummy selection gate line DSG.

With the configuration of FIGS. 7 and 8, the resistance change type memory of the present embodiment may control the potential of the dummy selection gate line DSG using a plurality of voltages with relatively simple control.

(b) Operation Example

An operation example of the resistance change type memory according to the first embodiment will be described with reference to FIGS. 9 to 12.

(b1) Write Operation

When an operation for the resistance change type memory is required, i.e. when a write operation is instructed to the resistance change type memory according to the first embodiment by a command to receive a command, a control signal, and an address from the memory controller, the control circuit 17 executes various controls for each circuit for the write operation.

The voltage generation circuit 16 generates various voltages for the write operation. The voltage generation circuit 16 transmits the generated voltages to the word line control circuit 12, the selection gate line control circuit 13, the global bit line control circuit 14, and the like.

One of the plurality of blocks CMB is selected based on a selected address ADR. In addition, the word line WL, the selection gate line SG, and the global bit line GBL are selected based on the selected address. Thus, the memory cell in the selected block CMB is selected.

The word line control circuit 12 selects one of the plurality of word lines WL in the selected block CMB based on the selected address ADR. Thus, the word line control circuit 12 activates the selected word line WL. The word line control circuit 12 applies a voltage for the write operation to the selected word line WL.

The word line control circuit 12 sets the unselected word line WL in the selected block CMB and the unselected word line WL in the unselected block CMB to a deactivated state. For example, the word line control circuit 12 applies a non-selection voltage to the unselected word lines WL. The word line control circuit 12 controls the potential of the dummy word line DWL.

The global bit line control circuit 14 selects one of the plurality of global bit lines GBL of the selected block CMB based on the selected address ADR. Thus, the global bit line control circuit 14 activates the selected global bit line GBL. The global bit line control circuit 14 applies a voltage for the write operation to the selected global bit line GBL.

The global bit line control circuit 14 sets the unselected global bit line GBL in the selected block CMB and the unselected global bit line GBL in the unselected block CMB to a deactivated state. For example, the global bit line control circuit 14 applies a non-selection voltage to the unselected global bit line GBL.

In the write operation, the magnitude of the voltage applied to the selected word line WL and the selected global bit line GBL is appropriately set based on whether an operation to be executed is a reset operation or a set operation.

The selection gate line control circuit 13 selects one of the plurality of selection gate lines SG of the selected block CMB based on the selected address ADR. Thus, the selection gate line control circuit 13 activates the selected selection gate line SG.

The selection gate line control circuit 13 sets the unselected selection gate line SG in the selected block CMB and the selection gate line SG and the dummy selection gate line DSG in the unselected block CMB to a deactivated state.

The selection gate line control circuit 13 controls the potential of the dummy selection gate line DSG.

In the resistance change type memory according to the first embodiment, the voltage applied to the dummy selection gate line DSG is controlled according to a position (address) of the selected selection gate line in the selected block CMB as described below.

<Case where Selection Gate Line Other than End Selection Gate Line is Selected>

In order to connect a selected cell to the global bit line GBL, one of the plurality of selection gate lines SG in the selected block CMB is selected (activated).

Figure 9:
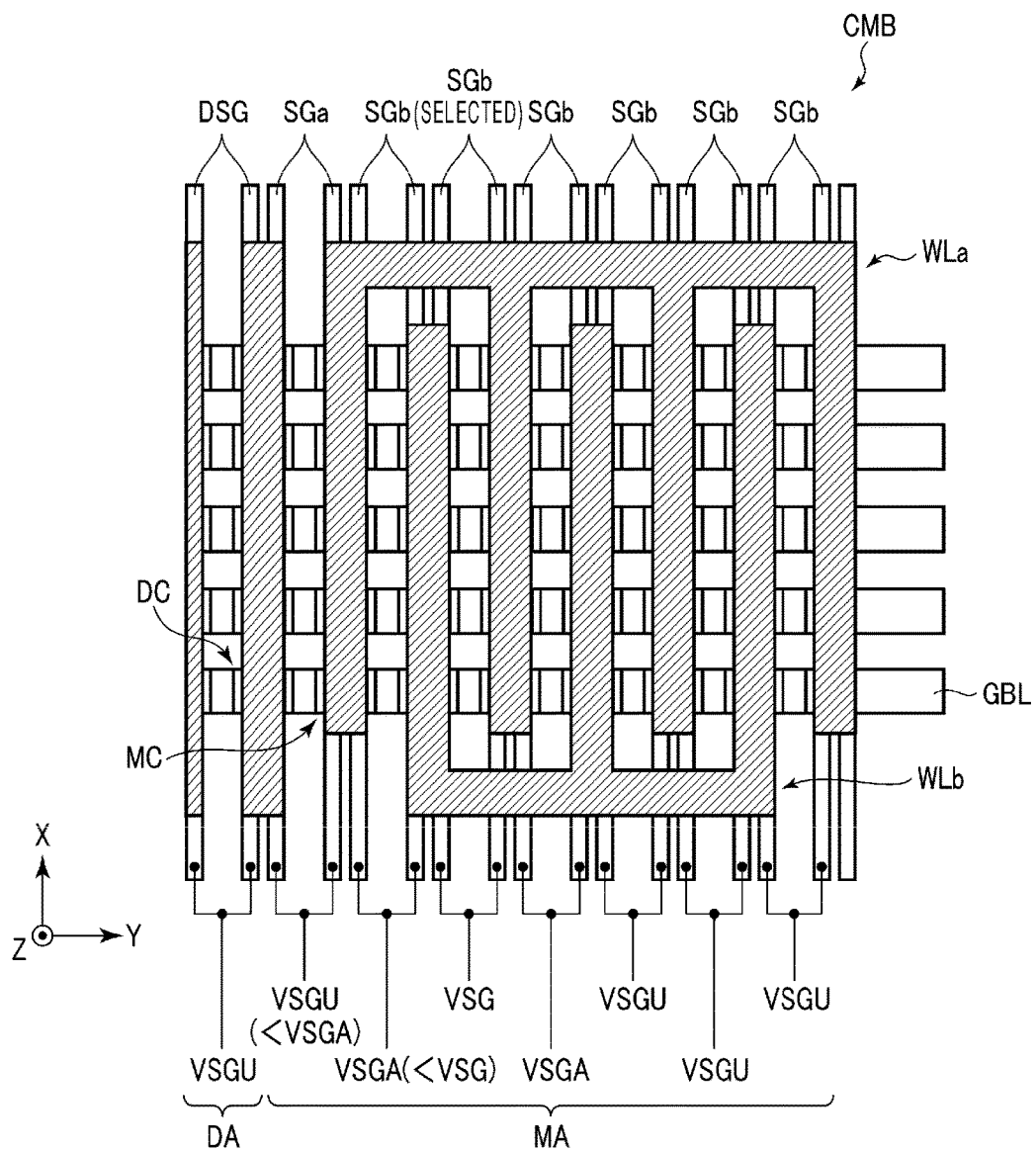
FIG. 9 is a schematic diagram for explaining an operation example of a resistance change type memory of the first embodiment.
Figure 10:
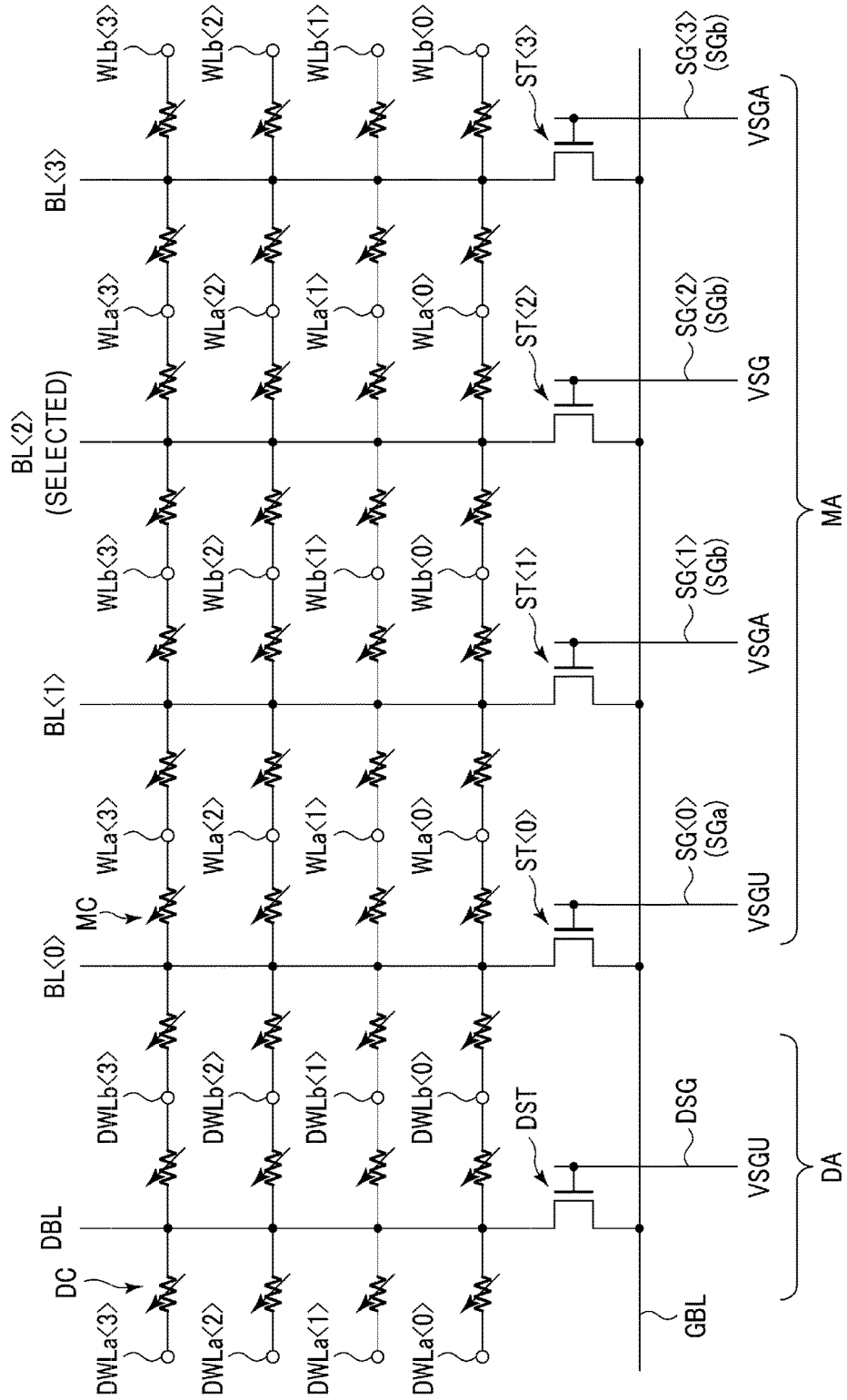
FIG. 10 is a circuit diagram of a resistance change type memory according to the first embodiment.

FIG. 9 is a schematic diagram for explaining a relationship between the potentials of the respective selection gate lines in a case where the selection gate line other than the end selection gate line is selected. FIG. 10 is a circuit diagram for explaining a relationship between the potentials of the respective selection gate lines in a case where the selection gate line other than the end selection gate line is selected.

As illustrated in the example of FIGS. 9 and 10, one selection gate line SGb (here, the selection gate line SG<2>) is selected (activated). The selection gate line SGb is disposed inside the block CMB compared to the end of the memory area MA. The selection gate line SGb is not adjacent to the dummy selection gate line DSG.

The selection voltage VSG is applied to the selected selection gate line SGb by the selection gate line decode circuit 130.

When the write operation is a set operation, the voltage value of the selection voltage VSG is set to 4V. When the write operation is a reset operation, the voltage value of the selection voltage VSG is set to 8.5 V.

The first non-selection voltage VSGA is applied to at least one selection gate line SGb, which is adjacent to the selected selection gate line SGb, by the corresponding selection gate line decode circuit 130. The voltage value of the first non-selection voltage VSGA is lower than the voltage value of the selection voltage VSG.

In the set operation, when the voltage value of the selection voltage VSG is 4V, the voltage value of the first non-selection voltage VSGA is set to 0.5V. In the reset operation, when the voltage value of the selection voltage VSG is 8.5V, the voltage value of the first non-selection voltage VSGA is set to 4V.

The second non-selection voltage VSGU is applied to the unselected selection gate line SG other than the unselected selection gate line SGb, which is adjacent to the selected selection gate line SGb.

The voltage value of the second non-selection voltage VSGU is lower than the voltage value of the first non-selection voltage VSGA.

When the end selection gate line SGa, which is adjacent to the dummy selection gate line DSG, is not selected, the second non-selection voltage VSGU is applied to the dummy selection gate line DSG by the dummy selection gate line decode circuit 139.

The potential difference between the dummy selection gate line DSG and the end selection gate line SGa is "VSGU−VSGU".

Thus, in the first embodiment, the potential difference between the dummy selection gate line DSG and the selection gate line SGa is small (substantially zero).

When the end selection gate line SGa is adjacent to the selected selection gate line SGb, the first non-selection voltage VSGA is applied to the end selection gate line SGa. In this case, the second non-selection voltage VSGU is applied to the dummy selection gate line DSG.

When the voltage VSGA is applied to the end selection gate line SGa, the potential difference (VSGU−VSGA) between the dummy selection gate line DSG and the end selection gate line SGa is smaller than the potential difference (VSGU−VSG) between the second non-selection voltage and the selection voltage.

<Case where End Selection Gate Line is Selected>

Figure 11:
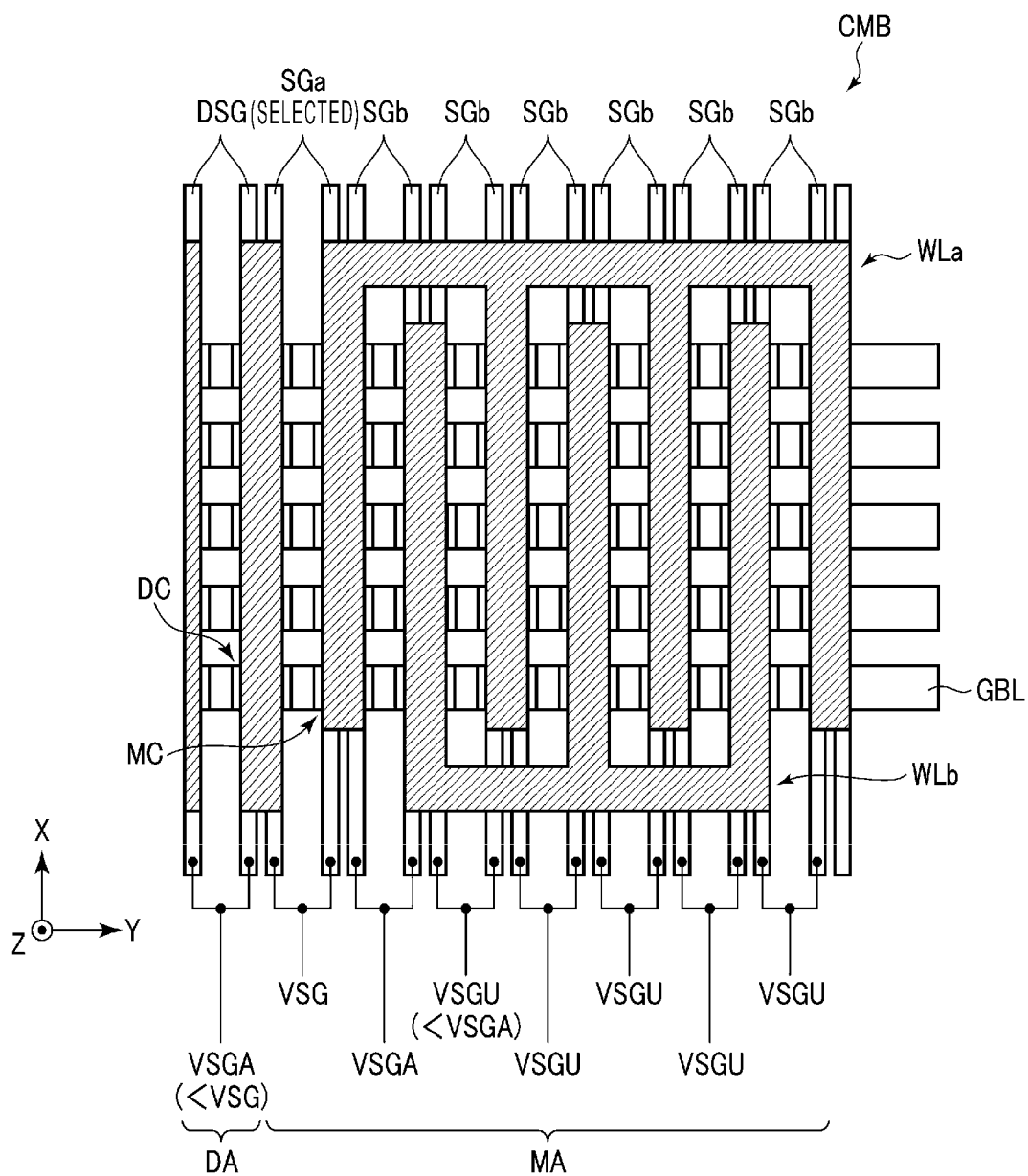
FIG. 11 is a schematic diagram for explaining an operation example of a resistance change type memory according to the first embodiment.
Figure 12:
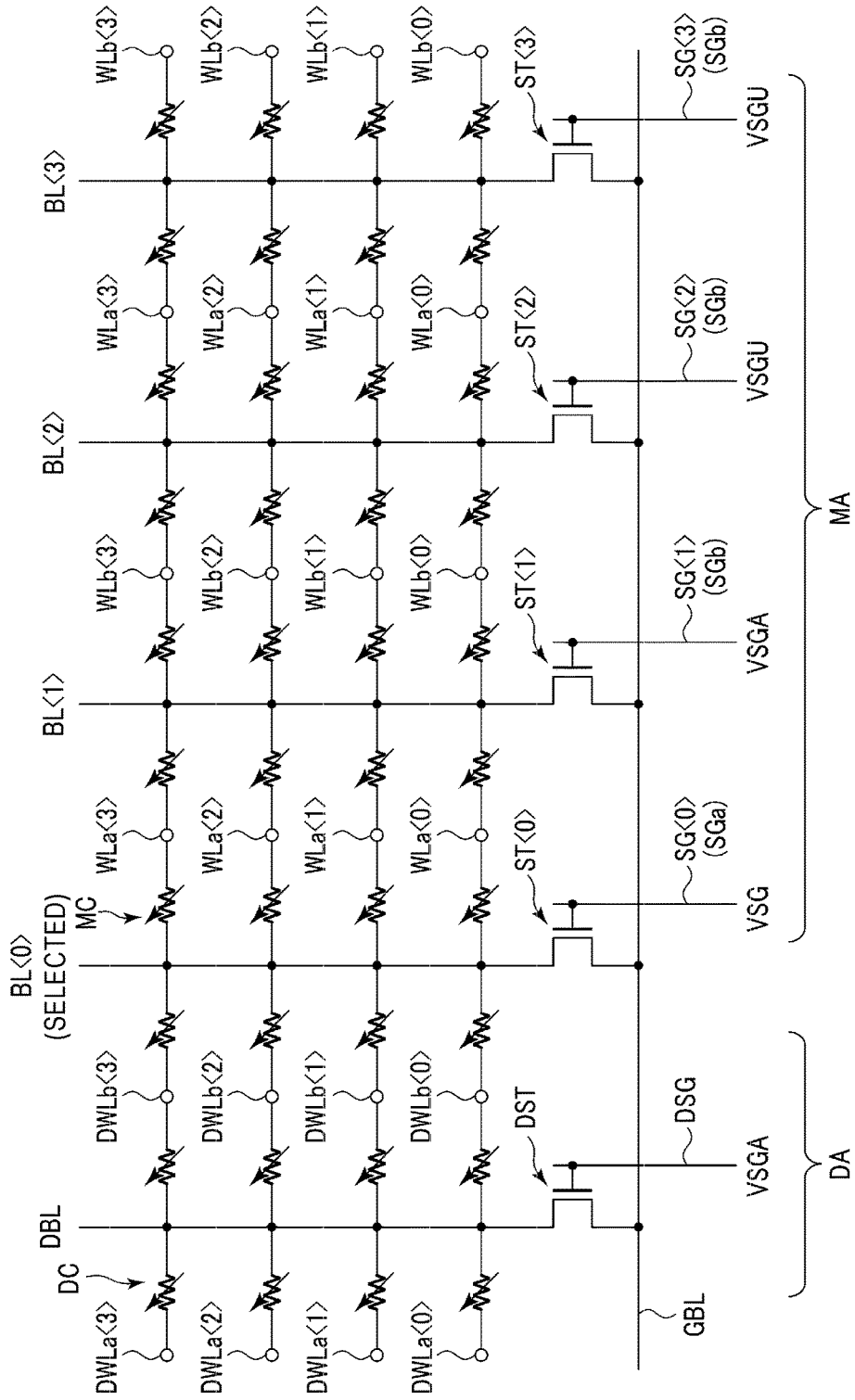
FIG. 12 is a circuit diagram of a resistance change type memory according to the first embodiment.

FIG. 11 is a schematic diagram for explaining a relationship between the potentials of the respective selection gate lines in a case where the end selection gate line is selected. FIG. 12 is a circuit diagram for explaining a relationship between the potentials of the respective selection gate lines in a case where the end selection gate line is selected.

As illustrated in the example of FIGS. 11 and 12, the end selection gate line SGa is selected (activated). The end selection gate line SGa is adjacent to the dummy selection gate line DSG.

The selection voltage VSG is applied to the selected end selection gate line SGa by the selection gate line decode circuit 130. The voltage value of the selection voltage VSG is set to a value depending on a set operation or a reset operation.

The first non-selection voltage VSGA is applied to the selection gate line SGb, which is adjacent to the end selection gate line SGa, by the selection gate line decode circuit 130.

The second non-selection voltage VSGU is applied to the unselected selection gate line SGb other than the unselected selection gate line SGb, which is adjacent to the selected selection gate line SGa.

As illustrated in FIGS. 11 and 12, when the selection gate line SGa, which is adjacent to the dummy selection gate line DSG, is selected, the first non-selection voltage VSGA (>VSGU) is applied to the dummy selection gate line DSG by the dummy selection gate line decode circuit 139.

Thus, in the first embodiment, the potential difference (VSGA−VSG) between the dummy selection gate line DSG and the end selection gate line SGa is smaller than the potential difference (VSGU−VSG) between the second non-selection voltage and the selection voltage.

As illustrated in FIGS. 9 to 12, in a state where a voltage having a voltage value depending on the position (address) of the selected selection gate line in the memory area MA is applied to the dummy selection gate line DSG, the potential difference (or supply of current) between the selected word line WL and the selected global the bit line GBL is controlled so that the write operation (set operation/reset operation) is executed.

Thus, predetermined data is written into the selected cell.

Thereafter, the selected word line, the selected global bit line, and the selected selection gate line are deactivated. The application of the voltage to each wiring in the selected block is stopped.

In the write operation for the selected block CMB, the voltage VSGU (e.g., 0V to 0.5V) is applied to the selection gate line SG and the dummy selection gate line DSG in the unselected block CMB.

(b2) Read Operation

A read operation of the resistance change type memory according to the first embodiment will be described.

The control of each wiring in the read operation of the resistance change type memory of the present embodiment is substantially the same as the control of each wiring in the write operation with reference to FIGS. 9 to 12.

However, the voltage value of the voltage applied to each wiring for reading data is different from the voltage value of the voltage applied to each wiring in the write operation.

When the selection gate line SGb other than the end selection gate line SGa is selected, one of the first non-selection voltage VSGA and the second non-selection voltage VSGU is applied to the end selection gate line SGa. In this case, the second non-selection voltage VSGU is applied to the dummy selection gate line DSG.

When the end selection gate line SGa is selected, the selection voltage VSG is applied to the end selection gate line SGa, and the first non-selection voltage VSGA is applied to the dummy selection gate line DSG.

The voltage values of the voltages VSG, VSGA, and VSGU in the read operation are different from the voltage values of the voltages VSG, VSGA, and VSGU in the write operation.

In the read operation, 6V is used as the voltage value of the selection voltage VSG.

When the voltage value of the selection voltage VSG is 6V, the voltage value of the first non-selection voltage VSGA is set to 4V and the voltage value of the second non-selection voltage VSGU is set to 0.5V.

In this way, in a state where the voltage having a voltage value depending on the position of the selected selection gate line is applied to the dummy selection gate line DSG, the read operation is executed.

The sense amplifier circuit 15 senses and amplifies a signal output from the selected cell to the global bit line GBL.

Thus, data in the selected cell is read out.

Thereafter, the selected word line, the selected global bit line, and the selected selection gate line are deactivated. The application of the voltage to each wiring in the selected block is stopped.

As described above, in a case where the resistance change type memory according to the first embodiment executes the read operation, the potential difference between the dummy selection gate line and the selection gate line, which are adjacent to each other, may also be reduced.

(c) Summary

As described above, the resistance change type memory according to the first embodiment includes a memory area and a dummy area adjacent to the memory area.

A dummy selection gate line is provided in the dummy area. The dummy selection gate line is adjacent to a selection gate line (end selection gate line) at the end in the memory area.

When a selection voltage VSG is applied to a selection gate line SGb other than the end selection gate line, first or second non-selection voltage VSGA or VSGU is applied to the end selection gate line SGa, and the second non-selection voltage VSGU (<VSGA) is applied to the dummy selection gate line DSG.

When the selection voltage VSG is applied to the end selection gate line SGa, the first non-selection voltage VSGA is applied to the dummy selection gate line DSG.

Thus, the resistance change type memory may prevent dielectric breakdown between the end selection gate line SGa and the dummy selection gate line DSG.

The resistance change type memory may prevent occurrence of leakage current by controlling the potential of the dummy selection gate line DSG.

Therefore, the resistance change type memory can improve the reliability of the memory.

(2) Second Embodiment

A resistance change type memory according to a second embodiment will be described with reference to FIGS. 13 and 14.

Figure 13:
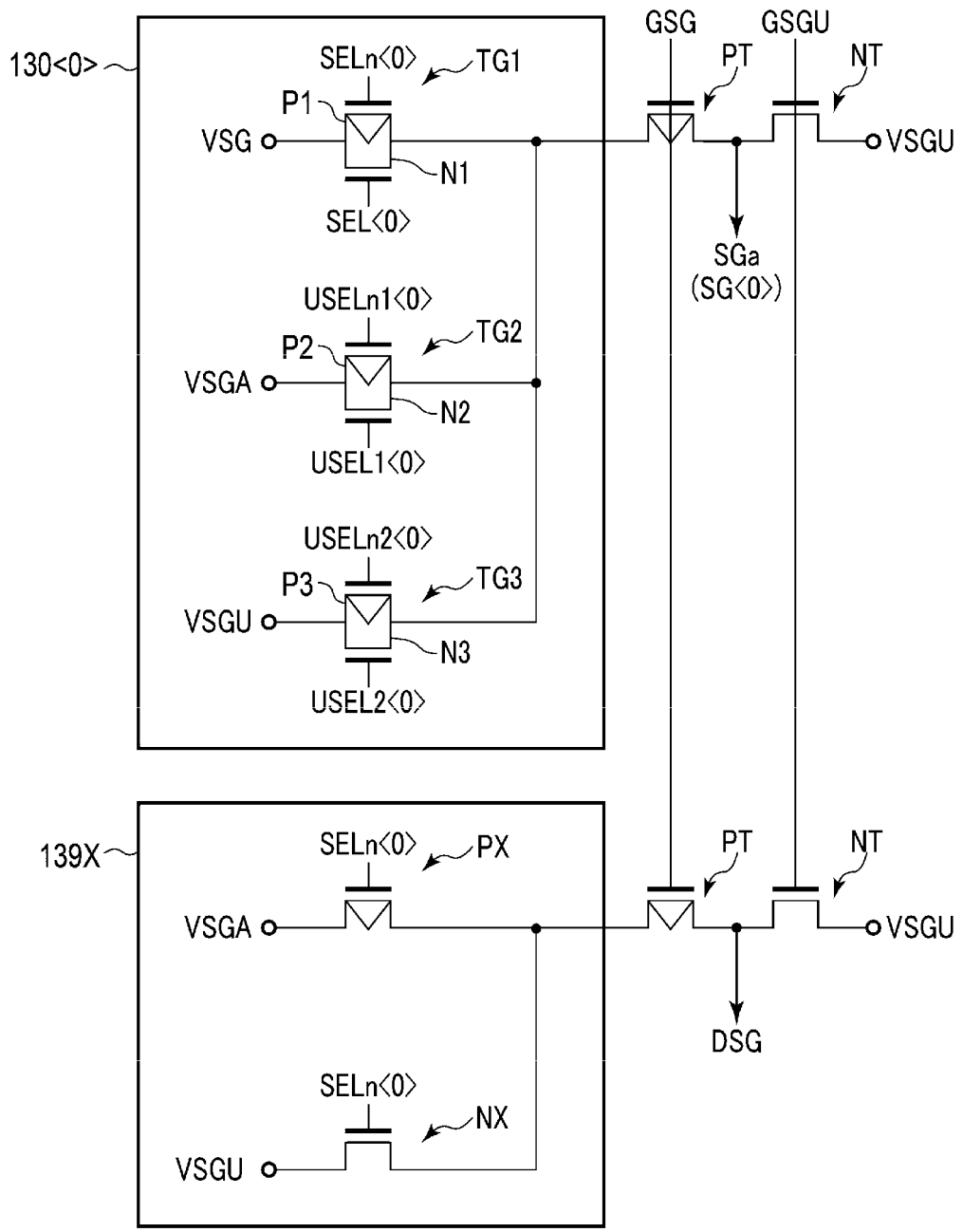
FIG. 13 is a circuit diagram of a resistance change type memory according to a second embodiment.
Figure 14:
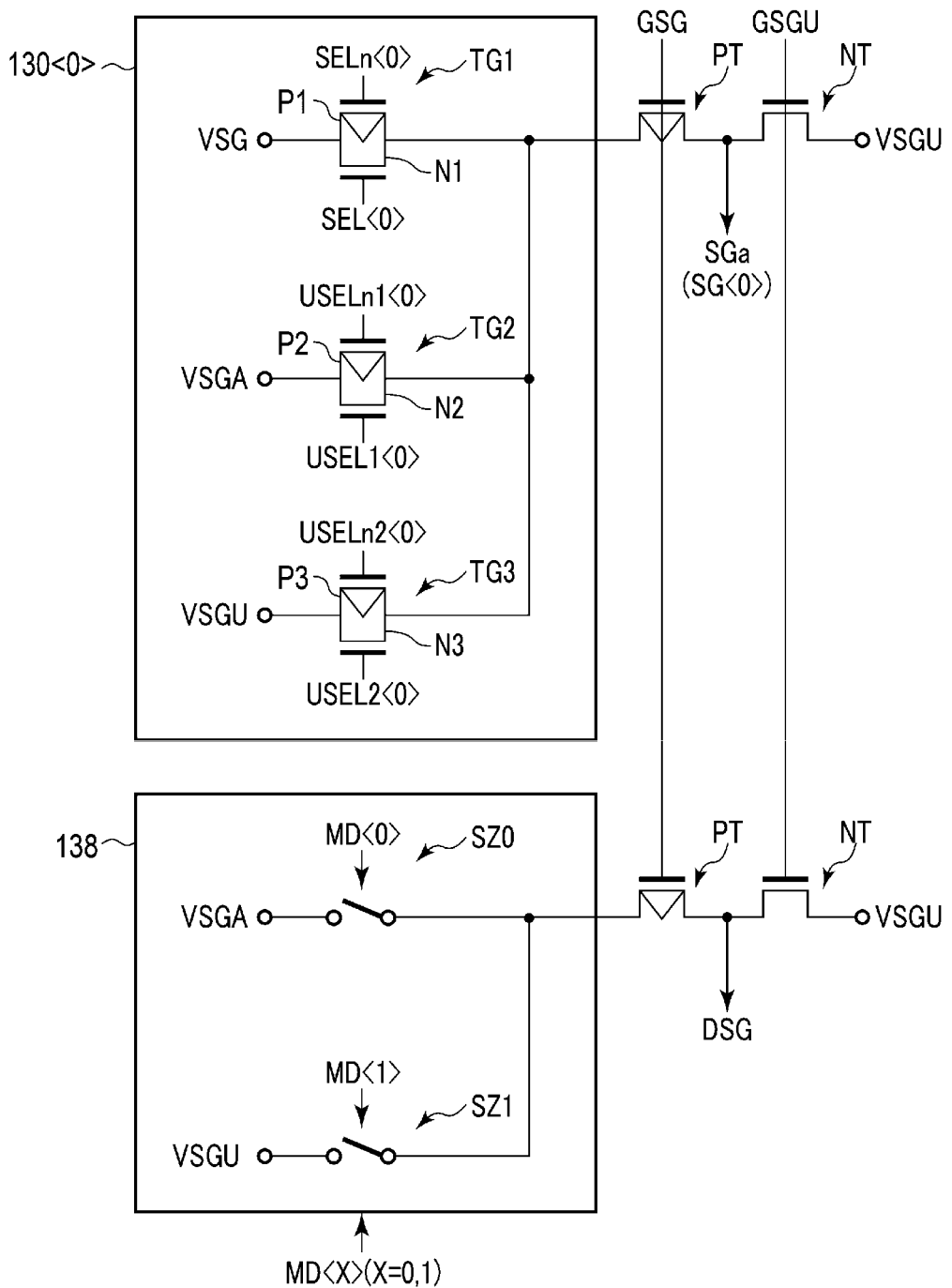
FIG. 14 is a circuit diagram of a resistance change type memory according to the second embodiment.

In FIGS. 13 and 14, a configuration example of a circuit for applying a voltage to the dummy selection gate line is illustrated.

FIG. 13 is an equivalent circuit diagram of the resistance change type memory according to the second embodiment.

As illustrated in FIG. 13, in a dummy selection gate line decode circuit 139X, a P-type transistor PX is used to apply the first non-selection voltage VSGA to the dummy selection gate line DSG.

One end of the P-type transistor PX is connected to a voltage terminal VSG. The other end of the P-type transistor PX is connected to the dummy selection gate line DSG via the current path of the P-type transistor PT.

The control signal SELn<0> is supplied to the gate of the P-type transistor PX.

To apply the second non-selection voltage VSGU to the dummy selection gate line DSG, an N-type transistor NX is used.

One end of the N-type transistor NX is connected to a voltage terminal VSGU. The other end of the N-type transistor NX is connected to the dummy selection gate line DSG via the current path of the P-type transistor PT.

The control signal SELn<0> is supplied to the gate of the N-type transistor NX.

The control signal SELn<0> is common to the P-type transistor PX and the N-type transistor NX. Therefore, during the operation of the selected block CMB, any one of the P-type transistor PX and the N-type transistor NX is turned on depending on selection/non-selection of the end selection gate line SGa.

The control signal SELn<0> is a signal (e.g., an inverted signal of a decode signal) generated from a decode signal of an address of the end selection gate line SGa.

When the end selection gate line SGa is selected (when the selection voltage VSG is applied to the end selection gate line SGa), for example, by the control signal SELn<0> of the "L" level, the P-type transistor PX is turned on and the N-type transistor NX is turned off.

Thus, the first non-selection voltage VSGA is applied to the dummy selection gate line DSG via the P-type transistor PX in the ON state.

In a case where the end selection gate line SGa is not selected (when the first non-selection voltage VSGU or the first non-selection voltage VSGU is applied to the end selection gate line SGa), for example, by the control signal SELn<0> of the "H" level, the P-type transistor PX is turned off and the N-type transistor NX is turned on.

Thus, the second non-selection voltage VSGU is applied to the dummy selection gate line DSG via the N-type transistor NX in the ON state.

By the circuit of FIG. 13, the number of elements in the dummy selection gate line decoder circuit may be reduced.

FIG. 14 is an equivalent circuit diagram of the resistance change type memory according to the second embodiment.

In FIG. 14, as to a circuit for controlling the potential of the selection gate line, a circuit example having a configuration different from that of FIG. 13 (and FIG. 8) is illustrated.

In FIG. 14, a voltage switch circuit 138 is used to apply a selected one of a plurality of voltages to the dummy selection gate line DSG.

The voltage switch circuit 138 includes a switch element SZ0, which outputs the first non-selection voltage VSGA, and a switch element SZ1, which outputs the second non-selection voltage VSGU.

A mode signal MD<i>(e.g., i=0, 1) is supplied to the voltage switch circuit 138 as a control signal.

When the end selection gate line SGa is selected, a first mode signal MD<0> is activated. Thus, the switch element SZ0 is turned on. In this case, the switch element SZ1 is in the OFF state.

The switch element SZ0 in the ON state outputs the first non-selection voltage VSGA to the dummy selection gate line DSG.

When the end selection gate line SGa is not selected, for example, a second mode signal MD<1> is activated. Thus, the switch element SZ1 is turned on. In this case, the switch element SZ0 is in the OFF state.

The switch element SZ1 in the ON state outputs the second non-selection voltage VSGU to the dummy selection gate line DSG.

The configuration of the circuit for applying a voltage to the dummy selection gate line is not limited to the specific example described above.

Therefore, the resistance change type memory according to the second embodiment may apply a voltage selected among a plurality of voltages to the dummy selection gate line depending on selection/non-selection of the selection gate line, which is adjacent to the dummy selection gate line.

As described above, the resistance change type memory according to the second embodiment is able to improve the reliability of the memory.

(3) Third Embodiment

The resistance change type memory according to a third embodiment will be described with reference to FIG. 15.

Figure 15:
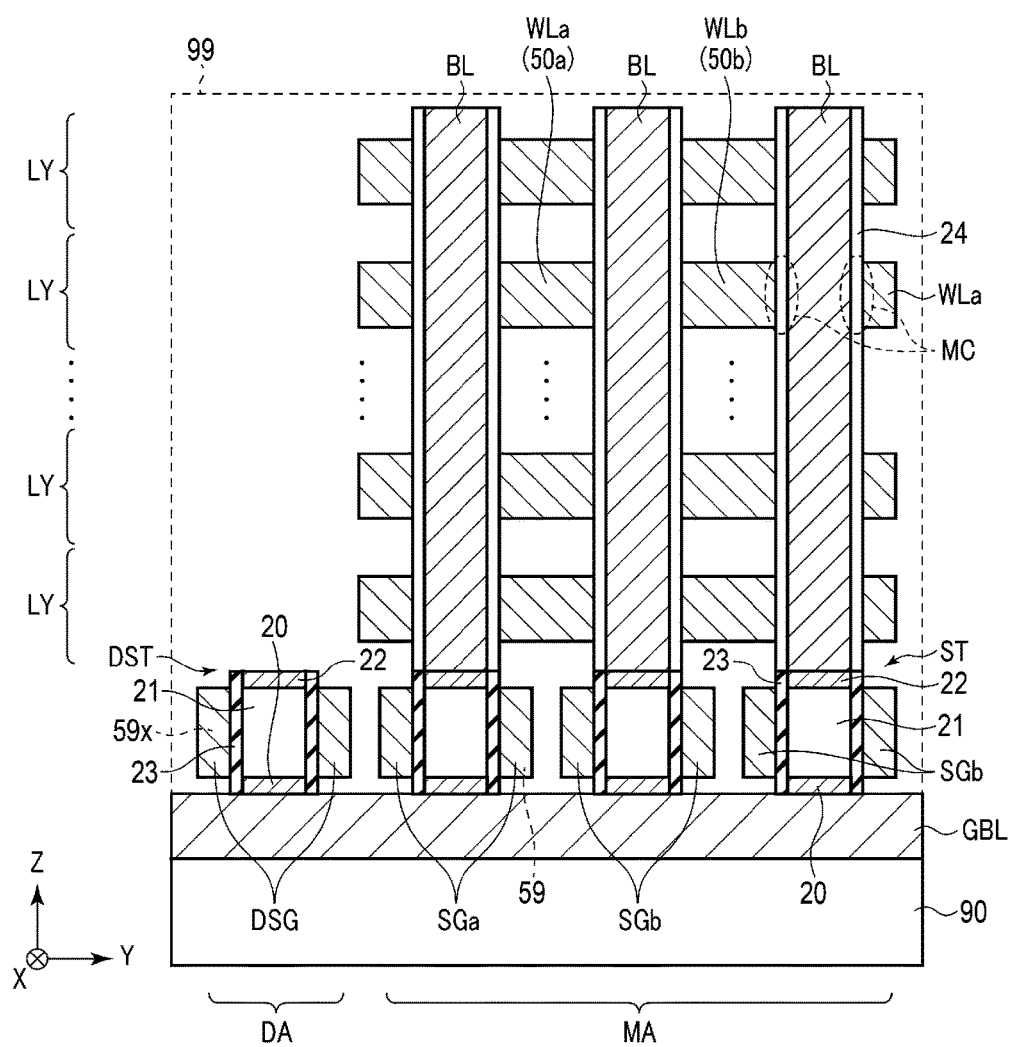
FIG. 15 is a cross-sectional view of a resistance change type memory according to a third embodiment.

FIG. 15 is a cross-sectional view of an example structure of the resistance change type memory according to the third embodiment.

As illustrated in FIG. 15, the dummy area DA need not include the dummy cell DC, the dummy word line DWL, and the dummy bit line DBL.

However, the dummy selection gate line DSG and the dummy selection transistor DST are provided in the dummy area DA.

For example, the upper portion (source/drain 22) of the dummy selection transistor DST is in contact with an interlayer insulating film 99.

Even in this case, when the potential difference between the dummy selection gate line DSG and the end selection gate line SGa is increased, there is a possibility of dielectric breakdown between the dummy selection gate line DSG and the end selection gate line SGa.

Therefore, even when the memory cell array having the structure of FIG. 15 is applied, as described above, a voltage selected among a plurality of voltages VSGA and VSGU is applied to the dummy selection gate line DSG depending on selection/non-selection of the selection gate line SGa, which is adjacent to the dummy selection gate line DSG.

Therefore, the resistance change type memory of the third embodiment is able to improve the reliability of the memory.

(4) Fourth Embodiment

A resistance change type memory according to a fourth embodiment will be described with reference to FIGS. 16 and 17.

In the resistance change type memory, the structure of the memory cell array is not limited to the example of FIG. 3.

Figure 16:
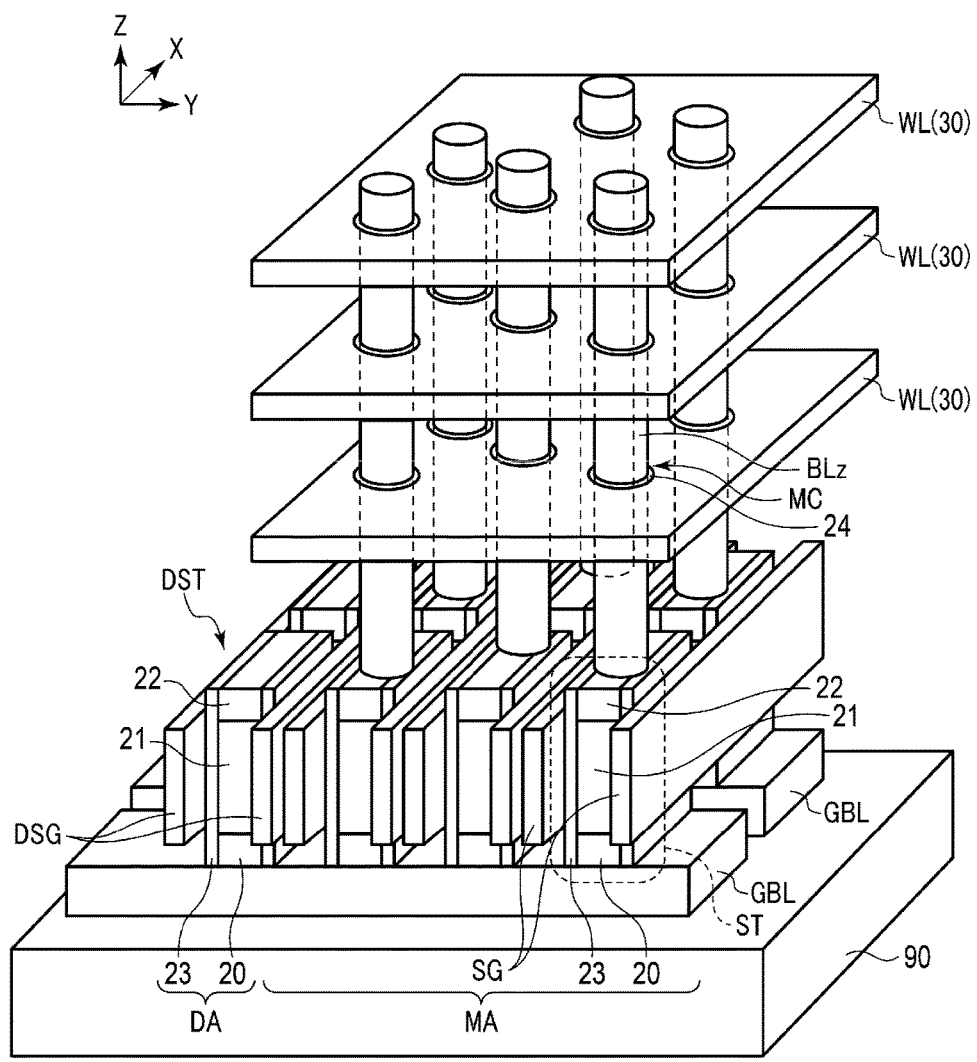
FIG. 16 is a perspective view of a resistance change type memory according to a fourth embodiment.

FIG. 16 is a perspective view of an example structure of a memory cell array of the resistance change type memory according to the fourth embodiment.

As illustrated in the memory cell array of FIG. 16, in the Z direction, a plurality of plate-shaped conductive layers 30 are stacked above the selection gate lines SG (and the selection transistors) on the substrate 90. One plate-shaped conductive layer 30 is used as one word line WL. Each conductive layer 30 has a plurality of through-holes (hereinafter, referred to as memory holes).

Columnar bit lines BLz extend in the Z direction. The bit lines BLz pass through the memory holes in the plurality of conductive layers 30.

A memory film 24 is provided between a bit line BLz and a conductive layer 30. The memory film 24 extends on the side face (outer periphery) of the bit line BLz in the Z direction.

A memory cell MC is provided in an area at which a bit line BL and a conductive layer 30 intersect with each other.

A plurality of selection transistors ST is provided below the memory cells MC.

The structure of the selection transistor ST is substantially the same as the structure of the selection transistor in the resistance change type memory according to the first embodiment.

Figure 17:
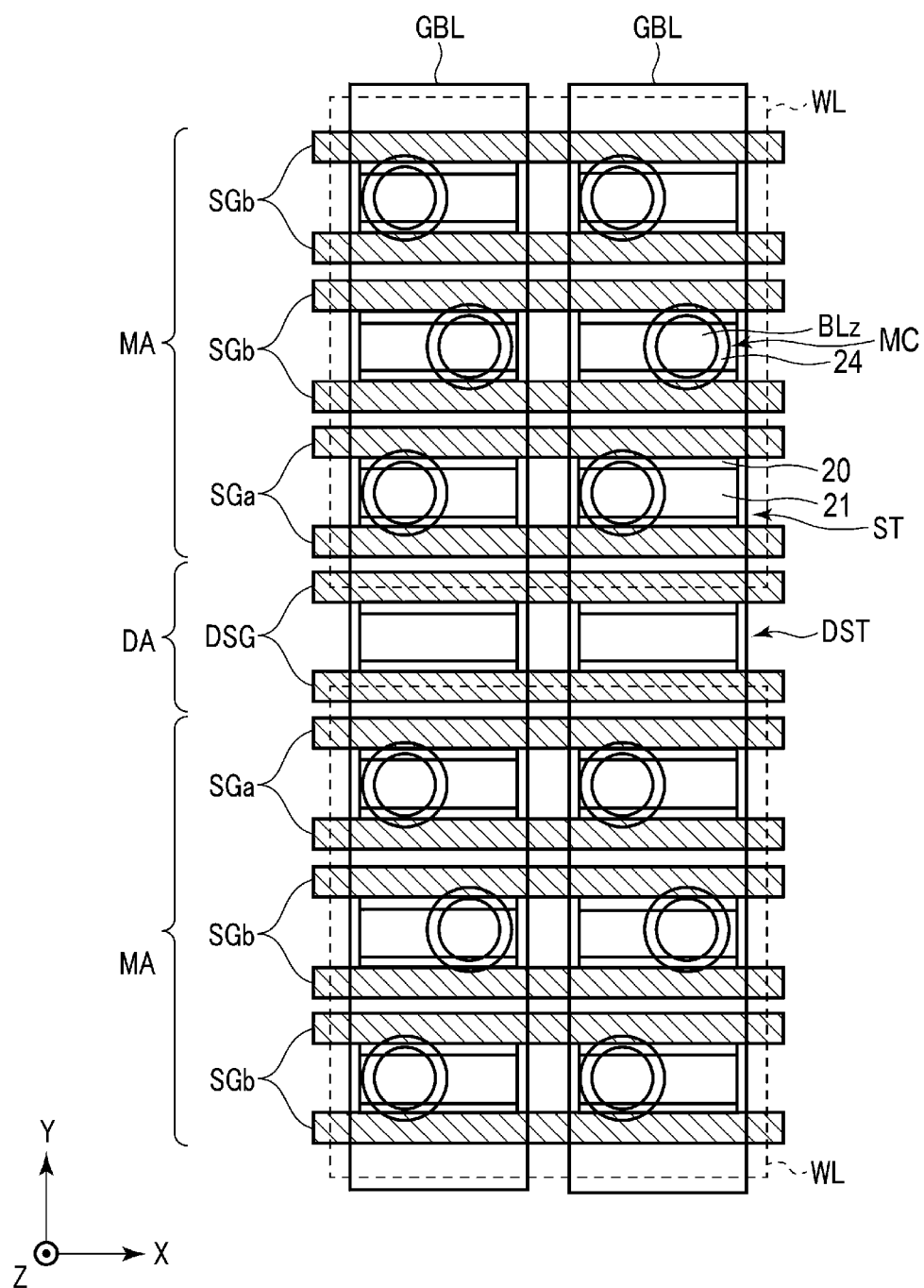
FIG. 17 is a plan view of a resistance change type memory according to the fourth embodiment.

FIG. 17 is a plan view of a planar structure of the memory cell array in the resistance change type memory of the fourth embodiment. In addition, since a cross-sectional structure of the resistance change type memory of the present embodiment is similar to the structure of FIG. 15, illustration thereof is omitted here.

As illustrated in FIG. 17, in a plurality of bit lines BLz connected to the same global bit line GBL, the plurality of bit lines BLz are disposed above the global bit line GBL and are alternately staggered in the X direction so as not to be aligned on the same line in the Y direction.

As illustrated in FIGS. 16 and 17, in the memory cell array in the resistance change type memory of the present embodiment, as in the above-described example, the dummy area DA is provided between the memory areas MA.

The dummy selection gate line DSG is provided in the dummy area DA.

A slit is formed between the word lines WL of adjacent memory areas MA. Thus, the word lines WL of two memory areas MA are electrically separated from each other. As a result, no memory cell (dummy cell) MC is provided in the dummy area DA.

A pair of conductive layers 59 as the dummy selection gate lines DSG are adjacent to each other in the Y direction with the semiconductor layer 21 interposed therebetween. The conductive layers 59 are located, for example, under the word lines WL in the Z direction.

In this way, on at least one side of the dummy selection gate line DSG in the Y direction, the dummy selection gate line DSG is adjacent to the end selection gate line SGa in the memory area MA.

In the resistance change type memory according to the fourth embodiment, similarly to the resistance change type memory according to the first embodiment, in a case where the selection gate line SGa adjacent to the dummy selection gate line DSG is selected, the first non-selection voltage VSGA (VSGU<VSGA<VSG) is applied to the dummy selection gate line DSG.

When the selection gate line SGa adjacent to the dummy selection gate line DSG is not selected, the second non-selection voltage VSGU is applied to the dummy selection gate line DSG.

Thereby, the resistance change type memory according to the fourth embodiment may obtain the same effect as the effect of the resistance change type memories according to the first to third embodiments.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change type memory device, comprising:
   a first bit line extending along a first direction perpendicular to a surface of a substrate;
   a second bit line extending along the first direction in parallel with the first bit line;
   a dummy bit line extending along the first direction in parallel with the first bit line and the second bit line, the first bit line, the second bit line, and the dummy bit line being spaced from each other in a second direction parallel to the surface of the substrate;
   a first word line extending along a third direction parallel to the surface of the substrate;
   a second word line extending along the third direction in parallel with the first word line;
   a first memory cell at a crossing of the first bit line and the first word line;
   a second memory cell at a crossing of the second bit line and the second word line;
   a first selection transistor between the first bit line and the substrate in the first direction, the first selection transistor having a first channel portion and a first gate portion connected to a first selection gate line;
   a second selection transistor between the second bit line and the substrate in the first direction, the second selection transistor having a second channel portion and a second gate portion connected to a second selection gate line;
   a dummy selection transistor between the dummy bit line and the substrate in the first direction, the dummy selection transistor having a dummy channel portion and a dummy gate portion connected to a dummy selection gate line, the dummy selection gate line being adjacent to the first selection gate line in the second direction and not adjacent to the second selection gate line in the second direction; and a control circuit configured to apply:
  when the first selection gate line is selected, a first voltage to the first selection gate line, and a second voltage to the dummy selection gate line, the second voltage being smaller than the first voltage, and
  when the second selection gate line is selected, the first voltage to the second selection gate line, the second voltage or a third voltage to the first selection gate line, and the third voltage to the dummy selection gate line, the third voltage being equal to or smaller than the second voltage.

2. The memory device according to claim 1, wherein
when the second selection gate line is selected and adjacent to the first selection gate line, the first control circuit applies the second voltage to the first selection gate line, and
when the second selection gate line is selected and not adjacent to the first selection gate line, the first control circuit applies the third voltage to the first selection gate line.

3. The memory device according to claim 1, wherein the control circuit comprises:
  a first decode circuit configured to apply to the first selection gate line:
    the first voltage based on a first signal when the first selection gate line is selected, and
    the second voltage or the third voltage based on a second signal when the second selection gate line is selected.

4. The memory device according to claim 3, wherein the control circuit further comprises:
  a second decode circuit configured to apply to the dummy selection gate line:
    the second voltage to the dummy selection gate line based on the first signal when the first selection gate line is selected, and
    the third voltage to the dummy selection gate line based on the second signal when the second selection gate line is selected.

5. The memory device according to claim 3, wherein the control circuit comprises:
  a second decode circuit including a first transistor of a first conductive type configured to output the second voltage and a second transistor of a second conductive type configured to output the third voltage, wherein
when the first signal is at a first level and the first transistor is in an ON state,
  the first selection gate line is selected,
  the first decode circuit applies the first voltage to the first selection gate line, and
  the second decode circuit applies the second voltage to the dummy selection gate line by the first transistor, and
when the first signal is at a second level and the second transistor is in an ON state,
  the second selection gate line is selected,
  the first decode circuit applies the second voltage or the third voltage to the first selection gate line, and
  the second circuit applies the third voltage to the dummy selection gate line by the second transistor.

6. The memory device according to claim 1, further comprising:

a dummy word line extending along the third direction; and
a dummy memory cell at a crossing of the dummy bit line and the dummy word line, wherein
the dummy selection transistor is between the dummy bit line and the substrate in the first direction.

7. The memory device according to claim 1, wherein the dummy selection transistor has an upper portion in contact with an insulating layer on the substrate.

8. A resistance change type memory device, comprising:
  a first bit line extending along a first direction perpendicular to a surface of a substrate;
  a second bit line extending along the first direction in parallel with the first bit line;
  a dummy bit line extending along the first direction in parallel with the first bit line and the second bit line, the first bit line, the second bit line, and the dummy bit line being spaced from each other in a second direction parallel to the surface of the substrate;
  a first conductive layer extending along a third direction parallel to the surface of the substrate;
  a second conductive layer extending along the third direction in parallel with the first conductive layer;
  a first memory cell at a crossing of the first bit line and the first conductive layer;
  a second memory cell at a crossing of the second bit line and the second conductive layer;
  a first selection transistor between the first memory cell and the substrate in the first direction, the first selection transistor having a first channel portion and a first gate portion connected to a first selection gate line;
  a second selection transistor between the second memory cell and the substrate in the first direction, the second selection transistor having a second channel portion and a second gate portion connected to a second selection gate line;
  a dummy selection transistor between the dummy bit line and the substrate in the first direction, the dummy selection transistor having a dummy channel portion and a dummy gate portion connected to a dummy selection gate line, the dummy selection gate line being adjacent to the first selection gate line in the second direction and not adjacent to the second selection gate line in the second direction; and
  a control circuit configured to apply:
    when the first selection gate line is selected, a first voltage to the first selection gate line, and a second voltage to the dummy selection gate line, the second voltage being smaller than the first voltage, and
    when the second selection gate line is selected, the first voltage to the second selection gate line, the second voltage or a third voltage to the first selection gate line, and the third voltage to the dummy selection gate line, the third voltage being equal to or smaller than the second voltage.

9. The memory device according to claim 8, further comprising:
  a first memory hole and a second memory hole extending through the first and second conductive layers in parallel along the first direction, wherein
  the first and second bit lines pass through the first and second memory holes, respectively.

10. The memory device according to claim 8, wherein
when the second selection gate line is selected and adjacent to the first selection gate line, the first control circuit applies the second voltage to the first selection gate line, and when the second selection gate line is selected and not adjacent to the first selection gate line, the first control circuit applies the third voltage to the first selection gate line.

11. The memory device according to claim 8, wherein the control circuit comprises:
a first decode circuit configured to apply to the first selection gate line:
the first voltage based on a first signal when the first selection gate line is selected, and
the second voltage or the third voltage based on a second signal when the second selection gate line is selected.

12. The memory device according to claim 11, wherein the control circuit further comprises:
a second decode circuit configured to apply to the dummy selection gate line:
the second voltage to the dummy selection gate line based on the first signal when the first selection gate line is selected, and
the third voltage to the dummy selection gate line based on the second signal when the second selection gate line is selected.

13. The memory device according to claim 11, wherein the control circuit comprises:
a second decode circuit including a first transistor of a first conductive type configured to output the second voltage and a second transistor of a second conductive type configured to output the third voltage, wherein
when the first signal is at a first level and the first transistor is in an ON state,
the first selection gate line is selected,
the first decode circuit applies the first voltage to the first selection gate line, and
the second decode circuit applies the second voltage to the dummy selection gate line by the first transistor, and
when the first signal is at a second level and the second transistor is in an ON state,
the second selection gate line is selected,
the first decode circuit applies the second voltage or the third voltage to the first selection gate line, and
the second circuit applies the third voltage to the dummy selection gate line by the second transistor.

14. The memory device according to claim 8, further comprising:
a dummy word line extending along the third direction; and
a dummy memory cell at a crossing of the dummy bit line and the dummy word line, wherein
the dummy selection transistor is between the dummy bit line and the substrate in the first direction.

15. The memory device according to claim 8, wherein the dummy selection transistor has an upper portion in contact with an insulating layer on the substrate.

16. A method for controlling a resistance change type memory device, comprising:
applying a first voltage to the first selection gate line and a second voltage to a dummy selection gate line connected to a dummy selection transistor when the first selection gate line, which is connected to a first selection transistor and adjacent to the dummy selection gate line, is selected; and
applying the first voltage to a second selection gate line, the second voltage or a third voltage to the first selection gate line, and the third voltage to the dummy selection gate line when a second selection gate line connected to a second selection transistor and not adjacent to the dummy selection gate line is selected, wherein
the second voltage is smaller than the first voltage, and
the third voltage is equal to or smaller than the second voltage.

17. The method according to claim 16, further comprising:
applying the second voltage to the first selection gate line when the second selection gate line is selected and adjacent to the first selection gate line; and
applying the third voltage to the first selection gate line when the second selection gate line is selected and not adjacent to the first selection gate line.

18. The method according to claim 16, further comprising:
receiving a first signal and a second signal;
applying the first voltage based on the first signal to the first selection gate line when the first selection gate line is selected; and
applying the second voltage or the third voltage based on the second signal to the first selection gate line when the second selection gate line is selected.

19. The method according to claim 18, further comprising:
applying the second voltage to the dummy selection gate line based on the first signal to the dummy selection gate line when the first selection gate line is selected; and
applying the third voltage to the dummy selection gate line based on the second signal to the dummy selection gate line when the second selection gate line is selected.

20. The method according to claim 18, further comprising:
applying the first voltage to the first selection gate line when the first signal is at a first level and the first selection gate line is selected;
applying the second voltage to the dummy selection gate line when the first signal is at the first level and the first selection gate line is selected;
applying the second voltage or the third voltage to the first selection gate line when the first signal is at a second level and the second selection gate line is selected; and
applying the third voltage to the dummy selection gate line when the first signal is at the second level and the second selection gate line is selected.

* * * * *